(12) United States Patent
Sutardja

(10) Patent No.: US 7,795,910 B1
(45) Date of Patent: Sep. 14, 2010

(54) FIELD-PROGRAMMABLE GATE ARRAY USING CHARGE-BASED NONVOLATILE MEMORY

(75) Inventor: Pantas Sutardja, Los Gatos, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/139,664

(22) Filed: Jun. 16, 2008

Related U.S. Application Data

(60) Provisional application No. 60/957,035, filed on Aug. 21, 2007.

(51) Int. Cl.
*H01L 25/00* (2006.01)
(52) U.S. Cl. ........................................................ 326/41
(58) Field of Classification Search ............. 326/37–41, 326/47, 101
See application file for complete search history.

(56) References Cited

U.S. PATENT DOCUMENTS

| | | | |
|---|---|---|---|
| 6,266,272 B1 * | 7/2001 | Kirihata et al. | 365/185.08 |
| 6,958,516 B2 | 10/2005 | Wong | |
| 7,015,102 B2 | 3/2006 | Wang | |
| 7,115,942 B2 | 10/2006 | Wang | |
| 7,180,125 B2 | 2/2007 | Wang | |
| 7,277,316 B2 * | 10/2007 | Turner | 365/149 |
| 2006/0028247 A1 * | 2/2006 | Hara et al. | 326/104 |

\* cited by examiner

*Primary Examiner*—Rexford N Barnie
*Assistant Examiner*—Thienvu V Tran

(57) ABSTRACT

A field-programmable gate-array (FPGA) includes a first memory cell having (i) a plurality of states, (ii) a first end, and (iii) a second end; a first configurable logic block (CLB) having an output directly coupled to the first end of the first memory cell; a second memory cell having (i) a plurality of states, (ii) a first end, and (iii) a second end; and a second CLB having an input directly coupled to the first end of the second memory cell. The output of the first CLB communicates with the input of the second CLB via (i) the second end of the first memory cell and (ii) the second end of the second memory cell based on (i) the state of the first memory cell and (ii) the state of the second memory cell. Each of the first memory cell and the second memory cell includes a single-transistor memory cell of nonvolatile memory.

28 Claims, 18 Drawing Sheets

FIELD-PROGRAMMABLE GATE ARRAY USING CHARGE-BASED NONVOLATILE MEMORY

CROSS-REFERENCE TO RELATED APPLICATIONS

This application claims the benefit of U.S. Provisional Application No. 60/957,035 filed on Aug. 21, 2007. The disclosure of the above application is incorporated herein by reference in its entirety.

FIELD

The subject matter of the present disclosure relates to integrated circuits (ICs), and more particularly to field-programmable gate arrays (FPGAs).

BACKGROUND

The background description provided herein is for the purpose of generally presenting the context of the disclosure. Work of the presently named inventors, to the extent it is described in this background section, as well as aspects of the description which may not otherwise qualify as prior art at the time of filing, are neither expressly nor impliedly admitted as prior art against the present disclosure.

Field-programmable gate arrays (FPGAs) are semiconductor devices comprising configurable logic blocks (CLBs) and programmable interconnections that interconnect the CLBs. The CLBs may be arranged in one or more arrays and can be programmed to perform functions of combinational and/or sequential logic. The programmable interconnections allow users to program connections between the CLBs. By programming CLBs and interconnections between the CLBs, users can configure an FPGA to perform complex logic functions. The CLBs and the programmable interconnections typically include memory that users can program. The memory may include static random access memory (SRAM). Since SRAM is volatile, the memory used in CLBs and programmable interconnections may need to be reprogrammed every time power is applied to the FPGA.

FIGS. 1A and 1B depict general components of a conventional FPGA 50. Referring to FIG. 1A, an exemplary layout of general components of the FPGA 50 in an integrated circuit (IC) is shown. The FPGA 50 may comprise at least one CLB array 100, at least one block RAM 52, a plurality of input-output blocks (IOBs) 54, a plurality of pins 56 of the IC, and at least one control module 58. To simplify discussion, a simplified functional block diagram of the FPGA 50 is shown in FIG. 1B-*including*, in particular, a CLB array 100, a block RAM 52, IOBs 54, and a control module 58.

The CLB array 100 may comprise a plurality of CLBs and programmable interconnections (not shown in FIGS. 1A and 1B). The block RAM 52 is an on-chip memory. The block RAM 52 may comprise several kilobits of RAM and may support dual-porting. The IOBs 54 may interface the components of the FPGA 50 to the pins 56 of the FPGA 50. Additionally, the IOBs 54 may interface the FPGA 50 to systems and devices that utilize the FPGA 50. The IOBs 54 may be arranged in banks, where each bank provides an interface that is based on an I/O standard. Thus, the FPGA 50 can communicate with devices that use the same or different interfaces. The control module 58 may generate clock signals that operate CLBs in the CLB array 100, the block RAM 52, and the IOBs 54. Additionally, the control module 58 may generate signals to address and program memory cells (not shown in FIGS. 1A and 1B), which are used to program the programmable interconnections.

Referring now to FIG. 2A, the CLB array 100 may comprise a plurality of CLBs 110 arranged in a matrix. Additionally, the CLB array 100 may comprise programmable interconnections that include connection switches C 120, routing switches S 130, and wiring segments 140. Each connection switch C 120 may connect an output of one CLB 110 to an input of another CLB 110. Additionally, the connection switches C 120 may connect inputs and/or outputs of the CLBs 110 to the wiring segments 140. Each routing switch S 130 may connect wiring segments 140 on one side of the routing switch S 130 to wiring segments 140 on other sides of the routing switch S 130. The wiring segments 140 may connect the CLBs 110 to the IOBs 54.

FIG. 2B shows one example of a conventional CLB 100 comprising multiple configurable logic elements (CLEs) 150-1, 150-2, ..., 150-N (collectively CLEs 150), where N is an integer greater than or equal to 1. Each CLE 150 may be programmed to perform different logic functions. Each CLE 150 may receive a plurality of inputs of a given CLB 110. Each CLE 150 may generate one output depending on the programming of the CLE 150. Thus, each CLB 110 comprising N CLEs 150 may have N outputs.

Referring now to FIGS. 3A-3C, each CLE 150 may comprise one programmable logic element such as a lookup table (LUT) or a multiplexer. For example, in FIG. 3A, the CLE 150-1 may comprise a LUT 152. The LUT 152 may receive k inputs and may include a $2^k$-bit memory 153 as shown in FIG. 3B. The CLE 150-1 may perform a predetermined logic function depending on the programming of memory 153. For example, memory 153 can be programmed to perform a k-input AND gate, a k-input OR gate, etc. Depending on the states of the k inputs, a memory location in memory 153 is addressed. The LUT 152 generates an output f that is equal to the value of the bit programmed in the memory location addressed by the k inputs. The output f of the LUT 152 is latched by a D flip-flop 154. The output of the D-flip-flop 154 is output by a multiplexer 156 as an output (Output-1) of the CLE 150-1.

As shown in FIG. 3C, the CLE 150-2 may comprise a multiplexer 158 and memory 160. When the multiplexer 158 receives a set of inputs, the multiplexer 158 may generate an output (Output-2) based on the inputs and the bits programmed in memory 160. The CLE 150-2 may perform a predetermined logic function depending on the programming of memory 160. For example, the CLE 150-2 may function as a k-input AND gate when the multiplexer 158 receives k inputs and memory 160 is programmed as follows. The bits bit-1, bit-2, ..., bit-N of the memory 160 may be programmed as 1, 0, ..., 0, respectively, where $N=2^k$. The output (Output-2) is equal to 1 only when all k inputs are 1, and the output-2 is 0 for all other states of the k inputs. In other words, the CLE 150-2 may function as a k-input AND gate when the memory 160 is programmed as above. As can be appreciated, the CLE 150-2 can perform other functions depending on the programming of memory 160.

Referring now to FIG. 4A, an example of programmable interconnections in the CLB array 100 is shown. A connection switch C 120-1 may communicate with a wiring segment 140-2 and may connect outputs of a CLB 110-1 to inputs of a CLB 110-2. A connection switch C 120-2 may communicate with a wiring segment 140-1 and may connect outputs of a CLB 110-3 to the inputs of the CLB 110-1.

As an example, the CLB 110-1 is shown to comprise three CLEs 150, namely, CLE-1 150-1, CLE-2 150-2, and CLE-3

150-3. The CLB 110-2 is also shown to comprise three CLEs 150, namely, CLE-1 150-4, CLE-2 150-5, and CLE-3 150-6. Similarly, the CLB 110-3 may comprise three CLEs 150 (not shown). Each of CLE-1 150-1, CLE-2 150-2, and CLE-3 150-3 receives three inputs and generates one output. Each of CLE-1 150-4, CLE-2 150-5, and CLE3 150-6 receives three inputs and generates one output. The inputs and outputs of the CLBs 110-1, 110-2, 110-3 may be buffered by line buffers 170.

Since each CLE 150 has three inputs and each CLB 110 has three outputs, each connection switch C 120-1, 120-2 is shown to comprise six pass-gate transistors (hereinafter transistors) and six memory cells M. For example, connection switch C 120-1 comprises transistors 122-1 through 122-6 (collectively transistors 122) and memory cells M 124-1 through 124-6 (collectively memory cells M 124). Each memory cell M 124 biases a gate of a corresponding transistor 122. Each transistor 122 is turned on or off depending on whether a corresponding memory cell M 124 is programmed to one of first and second states. The first and second states may be 1 and 0 (or 0 and 1), respectively. During programming, the control module 58 may generate signals that address and program the memory cells 124.

The connection switch C 120-1 may connect the outputs of the CLB 110-1 to the inputs of the CLB 110-2 as follows. The outputs of CLE-1 150-1, CLE-2 150-2, CLE-3 150-3 communicate with first ends (or terminals) of transistors 122-1, 122-2, 122-3, respectively. The inputs of CLE-1 150-4, CLE-2 150-5, CLE-3 150-6 communicate with first ends of transistors 122-4, 122-5, 122-6, respectively. The second ends of transistors 122 are connected to wires in the wiring segment 140-2 as shown.

When memory cells M 124-1, 124-6 are respectively programmed to turn on transistors 122-1, 122-6, the output of CLE-1 150-1 is connected to the inputs of CLE-1 150-4, CLE-2 150-5, and CLE-3 150-6. When memory cells M 124-2, 124-5 are respectively programmed to turn on transistors 122-2, 122-5, the output of CLE-2 150-2 is connected to the inputs of CLE-1 150-4, CLE-2 150-5, and CLE3 150-6. When memory cells M 124-3, 124-4 are respectively programmed to turn on transistors 122-3, 122-4, the output of CLE-3 150-3 is connected to the inputs of CLE-1 150-4, CLE-2 150-5, and CLE-3 150-6.

Additionally, a routing switch S 130-1 may route the outputs of the CLB 110-1 to the inputs of other CLBs 110, the IOBs 54, etc. via the wiring segments 140-2, 140-1. The routing switch S 130-1 may also route outputs of other CLBs 110, the IOBs 54, etc. to the inputs of CLB 110-2 via the wiring segments 140-2, 140-1. For example, the routing switch S 130-1 may route outputs of the CLB 110-3 to the inputs of the CLB 110-2 via the wiring segments 140-1, 140-2.

Specifically, the routing switch 130-1 may comprise a plurality of segment connection switches 132. The number of segment connection switches 132 may depend on the number of wires in the wiring segments 140-1, 140-2, which, in turn, may depend on the number of inputs and outputs of the CLBs 110. For example, since the CLBs 110-1, 110-2, 110-3 are shown to have three inputs and three outputs, the wiring segments 140-1,140-2 each comprises three wires. Accordingly, the routing switch 130-1 is shown to comprise a total of (3×3)=9 segment connection switches 132. Wires in the wiring segments 140-1, 140-2 may also be referred to as conductors of the wiring segments 140-1, 140-2.

Referring now to FIG. 4B, an exemplary schematic diagram of a segment connection switch 132 is shown. In particular, the segment connection switch 132 comprises six pass-gate transistors 134-1 through 134-6 (collectively transistors 134) and six memory cells M 136-1 through 136-6 (collectively memory cells M 136). Each memory cell M 136 biases the gate of a corresponding transistor 134. Each transistor 134 is turned on or off depending on whether the corresponding memory cell M 136 is programmed to one of first and second states. The first and second states may be 1 and 0 (or 0 and 1), respectively. During programming, the control module 58 may generate signals that address and program the memory cells 136.

Transistors 134 have may first and second ends (or terminals). Wires in the wiring segment 140-1 may have east (E) and west (W) ends.ABwires in the wiring segment 140-2 may have north (N) and south (S) ends. The first ends of transistors 134-1, 134-6 and the second end of the transistor 134-2 may be connected to the east (E) end of a wire in the wiring segment 140-1. The second end of the transistor 134-1 and the first ends of transistors 134-4, 134-5 may be connected to the north (N) end of a wire in the wiring segment 140-2. The second ends of transistors 134-4, 134-6 and the first end of the transistor 134-3 may be connected to the west (W) end of the wire in the wiring segment 140-1. The second ends of transistors 134-3, 134-5 and the first end of the transistor 134-2 may be connected to the south (S) end of the wire in the wiring segment 140-2.

When memory cell M 136-1 is programmed to turn on transistor 134-1, the east (E) end of a wire in the wiring segment 140-1 is connected to the north (N) end of a wire in the wiring segment 140-2. When memory cell M 136-2 is programmed to turn on transistor 134-2, the east (E) end of the wire in the wiring segment 140-1 is connected to the south (S) end of the wire in the wiring segment 140-2.

When memory cell M 136-3 is programmed to turn on transistor 134-3, the south (S) end of the wire in the wiring segment 140-2 is connected to the west (W) end of a wire in the wiring segment 140-1. When memory cell M 136-4 is programmed to turn on transistor 134-4, the west (W) end of the wire in the wiring segment 140-1 is connected to the north (N) end of the wire in the wiring segment 140-2.

When memory cell M 136-5 is programmed to turn on transistor 134-5, the south (S) end of the wire in the wiring segment 140-2 is connected to the north (N) end of the wire in the wiring segment 140-2. When memory cell M 136-6 is programmed to turn on transistor 134-6, the east (E) end of the wire in the wiring segment 140-1 is connected to the west (W) end of the wire in the wiring segment 140-1. Depending on the connections provided by the connection switches C 120 and the routing switches S 130-1, outputs of any of the CLBs 110, IOBs 54, etc. may communicate with inputs of any of the CLBs 110, IOBs 54, etc.

FIGS. 5A and 5B illustrate an example SRAM memory cell 180 that is typically used in memory cells 124 and 136. As shown in FIG. 5A, the SRAM memory cell 180 comprises six transistors T1 through T6. Transistors T3 through T6 form two cross-coupled inverters that store a 0 or a 1. Transistors T1 and T2 are called access transistors and control access to the SRAM memory cell 180. In FIG. 5B, a simplified schematic of the SRAM memory cell 180 comprising the cross-coupled inverters and the access transistors is shown.

Access to the SRAM memory cell 180 is controlled by a word line (WL) that controls the access transistors T1 and T2. By turning the access transistors on or off, the word line WL controls whether the SRAM memory cell 180 is connected to bit lines BL and BL' during read/write operations. The bit lines BL and BL' transfer data to and from the SRAM memory cell 180 during write and read operations. The control module 58 generates the signals to write/read data to/from the SRAM memory cell 180.

Specifically, during a write operation, the bit lines BL and BL' are set to a data value (e.g., a 0 or a 1) that is to be stored in the SRAM memory cell 180. If a 0 is to be written, BL is set to 0 and BL' is set to 1. Conversely, a 1 is written by inverting the data values of the bit lines BL and BL'. Setting the word line WL high (i.e., setting WL=1) latches the data present on the bit lines BL and BL' into the cross-coupled inverters in the SRAM memory cell 180. During a read operation, both the bit lines BL and BL' are initially pre-charged to a 1. The word line WL is set high, which turns on the access transistors T1 and T2, and data stored in the cross-coupled inverters is transferred to bit lines BL and BL'.

SUMMARY

A field-programmable gate-array (FPGA) comprises first and second memory cells and first and second configurable logic blocks (CLBs). The first and second memory cells each have a plurality of states, a first end, and a second end. The first CLB has an output that communicates with the first end of the first memory cell. The second CLB has an input that communicates with the first end of the second memory cell. The output of the first CLB communicates with the input of the second CLB via the second ends of the first and second memory cells based on the states of the first and second memory cells. Each of the first and second memory cells includes a single-transistor memory cell of nonvolatile memory.

In other features, each of the first and second memory cells includes a ballistic-charge injection memory cell. Each of the first and second memory cells includes a phase-change memory cell. Each of the first and second memory cells includes a flash memory cell.

In another feature, the FPGA further comprises a first wiring segment that includes a first conductor. The second end of the first memory cell communicates with the second end of the second memory cell via the first conductor.

In other features, the FPGA further comprises a third memory cell having a plurality of states, a first end that communicates with the first conductor, and a second end. The FPGA further comprises a third CLB that communicates with the second end of the third memory cell via the first conductor. The third CLB communicates with at least one of the first and second CLBs via the first conductor and via the third memory cell based on a state of the third memory cell.

In other features, the FPGA further comprises a fourth memory cell having a plurality of states, a first end that communicates with the first conductor, and a second end. The FPGA further comprises a second wiring segment that includes a second conductor that communicates with the second end of the fourth memory cell. The FPGA further comprises a fourth CLB that communicates with the second end of the fourth memory cell via the second conductor. The fourth CLB communicates with at least one of the first and second CLBs via the second conductor, the fourth memory cell, and the first conductor based on a state of the fourth memory cell.

In other features, the FPGA further comprises a fifth memory cell having a plurality of states, a first end that communicates with the fourth CLB via the second conductor, and a second end. The FPGA further comprises a fifth CLB that communicates with the second end of the fifth memory cell via the second conductor. The fifth CLB communicates with the fourth CLB via the second conductor and via the fifth memory cell based on a state of the fifth memory cell.

In other features, the FPGA further comprises a sixth memory cell having a plurality of states, a first end that communicates with the second end of the fifth memory cell, and a second end that communicates with the first end of the fourth memory cell. The fifth CLB communicates with at least one of the first and second CLBs via the second conductor, the sixth memory cell, and the first conductor based on a state of the sixth memory cell.

In other features, the FPGA further comprises a seventh memory cell having a plurality of states, a first end that communicates with the first end of the sixth memory cell, and a second end that communicates with the second end of the third memory cell. The fifth CLB communicates with the third CLB via the second conductor, the seventh memory cell, and the first conductor based on a state of the seventh memory cell.

In other features, the FPGA further comprises an eighth memory cell having a plurality of states, a first end that communicates with the second end of the third memory cell, and a second end that communicates with the second end of the fourth memory cell. The third CLB communicates with the fourth CLB via the first conductor, the eighth memory cell, and the second conductor based on a state of the eighth memory cell.

In another feature, each of the third, fourth, fifth, sixth, seventh, and eighth memory cells includes the single-transistor memory cell.

In other features, the FPGA further comprises a control module that generates control signals. The control signals control addressing and biasing of the first, second, third, fourth, fifth, sixth, seventh, and eighth memory cells when the FPGA is programmed.

In another feature, the FPGA further comprises input/output blocks (IOBs) that interface the FPGA to devices that are external to the FPGA.

In another feature, the first, second, third, fourth, and fifth CLBs include N configurable logic elements (CLEs), where N is an integer greater than or equal to 1.

In still other features, a method comprises providing first and second memory cells each having a plurality of states, a first end, and a second end and each including a single-transistor memory cell of non-volatile memory. The method further comprises providing a first configurable logic block (CLB) having an output and communicating with the output of the first CLB and the first end of the first memory cell. The method further comprises providing a second CLB having an input and communicating with the input of the second CLB and the first end of the second memory cell. The method further comprises communicating with the output of the first CLB and the input of the second CLB via the second ends of the first and second memory cells based on the states of the first and second memory cells.

In another feature, the method further comprises providing one of a ballistic-charge injection memory cell, a phase-change memory cell, and a flash memory cell in each of the first and second memory cells.

In another feature, the method further comprises providing a first wiring segment having a first conductor and communicating with the second end of the first memory cell and the second end of the second memory cell via the first conductor.

In other features, the method further comprises providing a third memory cell having a plurality of states, a first end, and a second end and communicating with the first end of the third memory cell and the first conductor. The method further comprises providing a third CLB and communicating with the third CLB and the second end of the third memory cell via the first conductor. The method further comprises communicating with the third CLB and at least one of the first and second CLBs via the first conductor and via the third memory cell based on a state of the third memory cell.

In other features, the method further comprises providing a fourth memory cell having a plurality of states, a first end, and a second end and communicating with the first end of the fourth memory cell and the first conductor. The method further comprises providing a second wiring segment having a second conductor and communicating with the second conductor and the second end of the fourth memory cell.

In other features, the method further comprises providing a fourth CLB and communicating with the fourth CLB and the second end of the fourth memory cell via the second conductor. The method further comprises communicating with the fourth CLB and at least one of the first and second CLBs via the second conductor, the fourth memory cell, and the first conductor based on a state of the fourth memory cell.

In other features, the method further comprises providing a fifth memory cell having a plurality of states, a first end, and a second end and communicating with the first end of the fifth memory cell and the fourth CLB via the second conductor. The method further comprises providing a fifth CLB and communicating with the fifth CLB and the second end of the fifth memory cell via the second conductor. The method further comprises communicating with the fourth and fifth CLBs via the second conductor and via the fifth memory cell based on a state of the fifth memory cell.

In other features, the method further comprises providing a sixth memory cell having a plurality of states, a first end, and a second end and communicating with the first end of the sixth memory cell and the second end of the fifth memory cell. The method further comprises communicating with the second end of the sixth memory cell and the first end of the fourth memory cell. The method further comprises communicating with the fifth CLB and at least one of the first and second CLBs via the second conductor, the sixth memory cell, and the first conductor based on a state of the sixth memory cell.

In other features, the method further comprises providing a seventh memory cell having a plurality of states, a first end, and a second end and communicating with the first ends of the sixth and seventh memory cells. The method further comprises communicating with the second ends of the seventh and third memory cells. The method further comprises communicating with the third and fifth CLBs via the second conductor, the seventh memory cell, and the first conductor based on a state of the seventh memory cell.

In other features, the method further comprises providing an eighth memory cell having a plurality of states, a first end, and a second end and communicating with the first end of the eighth memory cell and the second end of the third memory cell. The method further comprises communicating with the second ends of the fourth and eighth memory cells. The method further comprises communicating with the third and fourth CLBs via the first conductor, the eighth memory cell, and the second conductor based on a state of the eighth memory cell.

In another feature, the method further comprises providing the single-transistor memory cell in each of the third, fourth, fifth, sixth, seventh, and eighth memory cells.

In other features, the method further comprises generating control signals and controlling addressing and biasing of the first, second, third, fourth, fifth, sixth, seventh, and eighth memory cells based on the control signals. The method further comprises programming a field-programmable gate-array (FPGA) comprises the first, second, third, fourth, fifth, sixth, seventh, and eighth memory cells, the first, second, third, fourth, and fifth CLBs, and the first and second wiring segments.

In another feature, the method further comprises providing N configurable logic elements (CLEs) in the first, second, third, fourth, and fifth CLBs, where N is an integer greater than or equal to 1.

In still other features, a field-programmable gate-array (FPGA) comprises first and second storage means for storing data. Each of the first and second storage means has a plurality of states, a first end, and a second end. The FPGA further comprises first and second configurable logic block (CLB) means for configuring the FPGA. The first CLB means has an output that communicates with the first end of the first storage means. The second CLB means has an input that communicates with the first end of the second storage means. The output of the first CLB means communicates with the input of the second CLB means via the second ends of the first and second storage means based on the states of the first and second storage means. Each of the first and second storage means includes single-transistor storage means of nonvolatile memory for storing data.

In other features, each of the first and second storage means includes a ballistic-charge injection storage means for storing data. Each of the first and second storage means includes a phase-change storage means for storing data. Each of the first and second storage means includes a flash storage means for storing data.

In another feature, the FPGA further comprises a first wiring segment that includes a first conductor. The second end of the first storage means communicates with the second end of the second storage means via the first conductor.

In other features, the FPGA further comprises third storage means for storing data. The third storage means has a plurality of states, a first end that communicates with the first conductor, and a second end. The FPGA further comprises third CLB means for configuring the FPGA. The third CLB means communicates with the second end of the third storage means via the first conductor. The third CLB means communicates with at least one of the first and second CLB means via the first conductor and via the third storage means based on a state of the third storage means.

In other features, the FPGA further comprises fourth storage means for storing data. The fourth storage means has a plurality of states, a first end that communicates with the first conductor, and a second end. The FPGA further comprises a second wiring segment that includes a second conductor that communicates with the second end of the fourth storage means. The FPGA further comprises fourth CLB means for configuring the FPGA. The fourth CLB means communicates with the second end of the fourth storage means via the second conductor. The fourth CLB means communicates with at least one of the first and second CLB means via the second conductor, the fourth storage means, and the first conductor based on a state of the fourth storage means.

In other features, the FPGA further comprises fifth storage means for storing data. The fifth storage means has a plurality of states, a first end that communicates with the fourth CLB means via the second conductor, and a second end. The FPGA further comprises fifth CLB means for configuring the FPGA. The fifth CLB means communicates with the second end of the fifth storage means via the second conductor. The fifth CLB means communicates with the fourth CLB means via the second conductor and via the fifth storage means based on a state of the fifth storage means.

In other features, the FPGA further comprises sixth storage means for storing data. The sixth storage means has a plurality of states, a first end that communicates with the second end of the fifth storage means, and a second end that communicates with the first end of the fourth storage means. The fifth CLB means communicates with at least one of the first and second CLB means via the second conductor, the sixth storage means, and the first conductor based on a state of the sixth storage means.

In other features, the FPGA further comprises seventh storage means for storing data. The seventh storage means has a plurality of states, a first end that communicates with the first end of the sixth storage means, and a second end that communicates with the second end of the third storage means. The fifth CLB means communicates with the third CLB means via the second conductor, the seventh storage means, and the first conductor based on a state of the seventh storage means.

In other features, the FPGA further comprises eighth storage means for storing data. The eighth storage means has a plurality of states, a first end that communicates with the second end of the third storage means, and a second end that communicates with the second end of the fourth storage means. The third CLB means communicates with the fourth CLB means via the first conductor, the eighth storage means, and the second conductor based on a state of the eighth storage means.

In another feature, each of the third, fourth, fifth, sixth, seventh, and eighth storage means includes the single-transistor storage means.

In another feature, the FPGA further comprises control means for generating control signals and for controlling addressing and biasing of the first, second, third, fourth, fifth, sixth, seventh, and eighth storage means based on the control signals when the FPGA is programmed.

In another feature, the FPGA further comprises input/output blocks (IOBs) that interface the FPGA to devices that are external to the FPGA.

In another feature, the first, second, third, fourth, and fifth CLB means include N configurable logic element (CLE) means for configuring the FPGA, where N is an integer greater than or equal to 1.

Further areas of applicability of the present disclosure will become apparent from the detailed description provided hereinafter. It should be understood that the detailed description and specific examples, while indicating various embodiments, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1A:
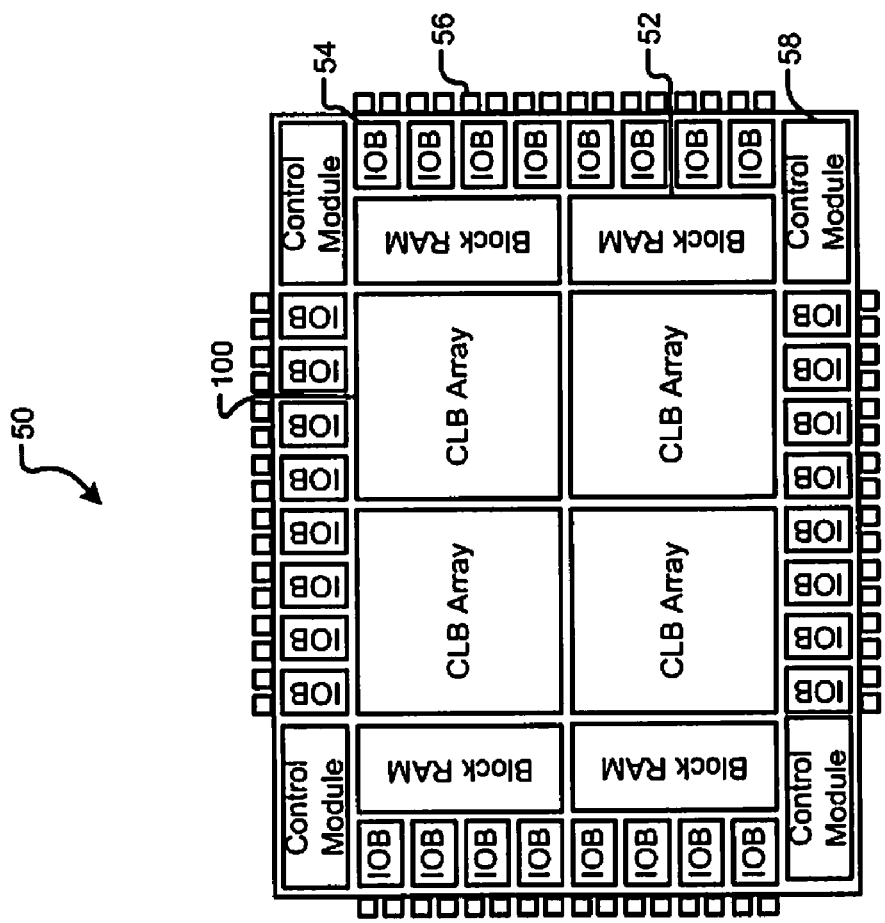
FIG. 1A depicts an exemplary field programmable gate array (FPGA) according to the prior art.
Figure 1B:
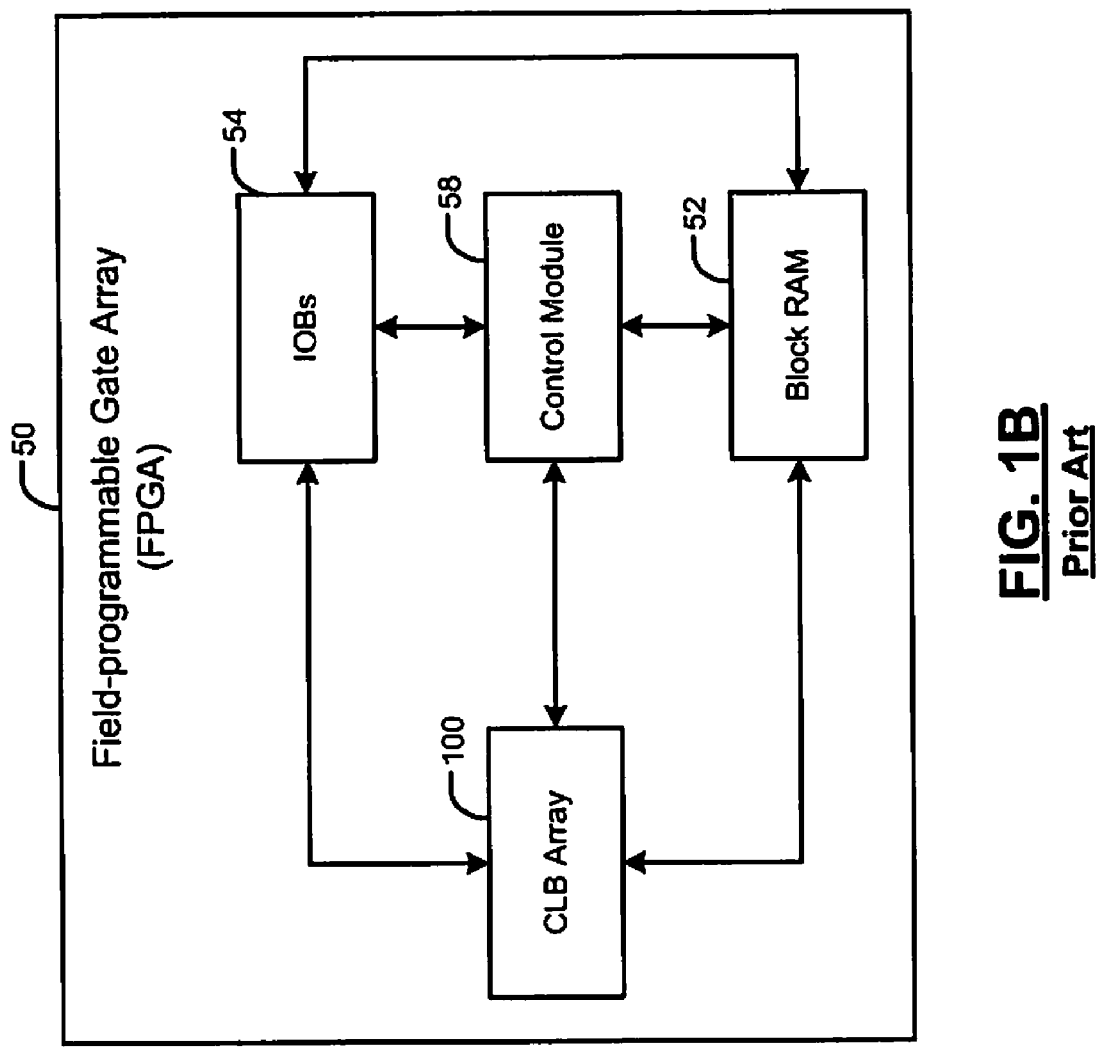
FIG. 1B is a functional block diagram of an exemplary FPGA according to the prior art.
Figure 2A:
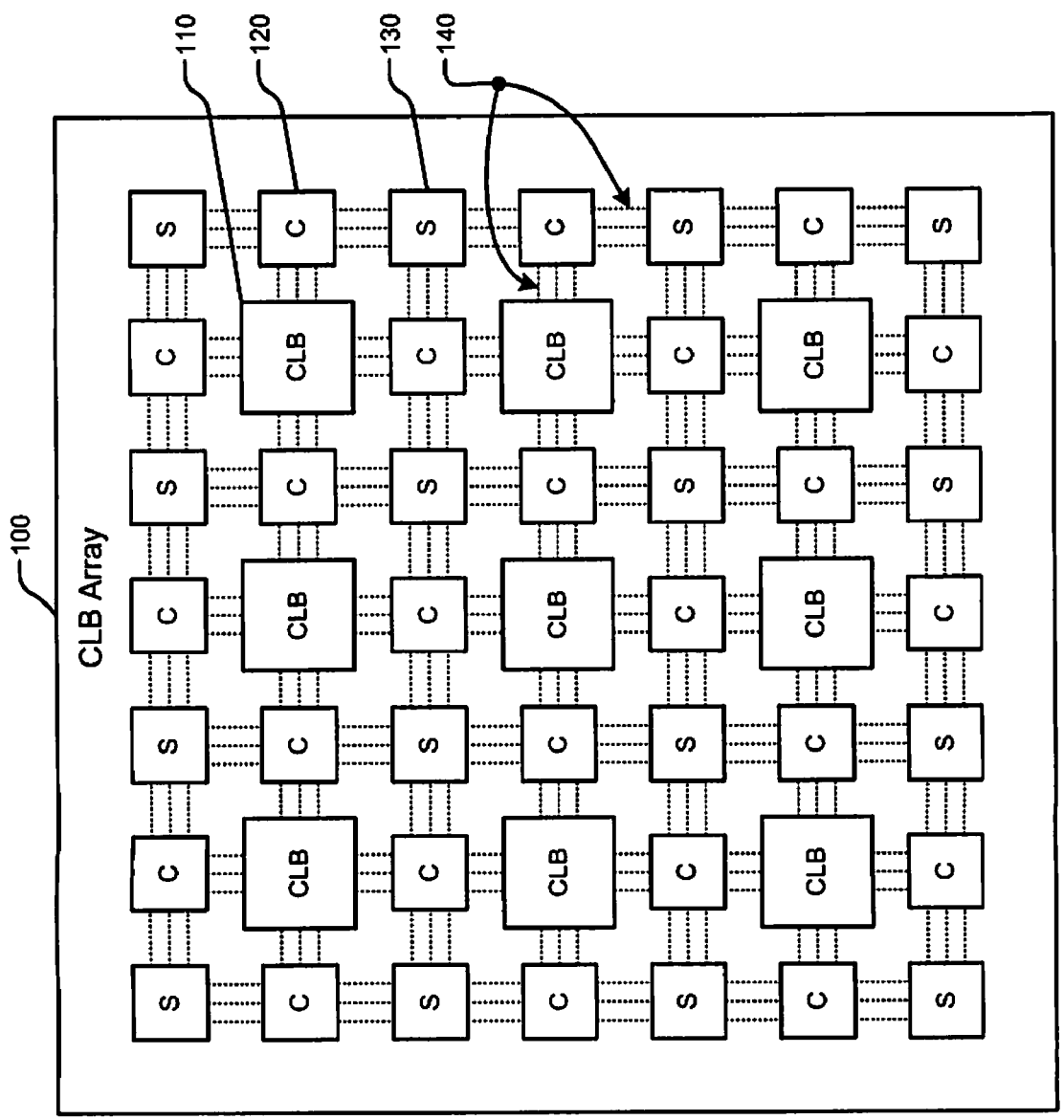
FIG. 2A depicts an exemplary array of configurable logic blocks (CLBs) in a FPGA according to the prior art.
Figure 2B:
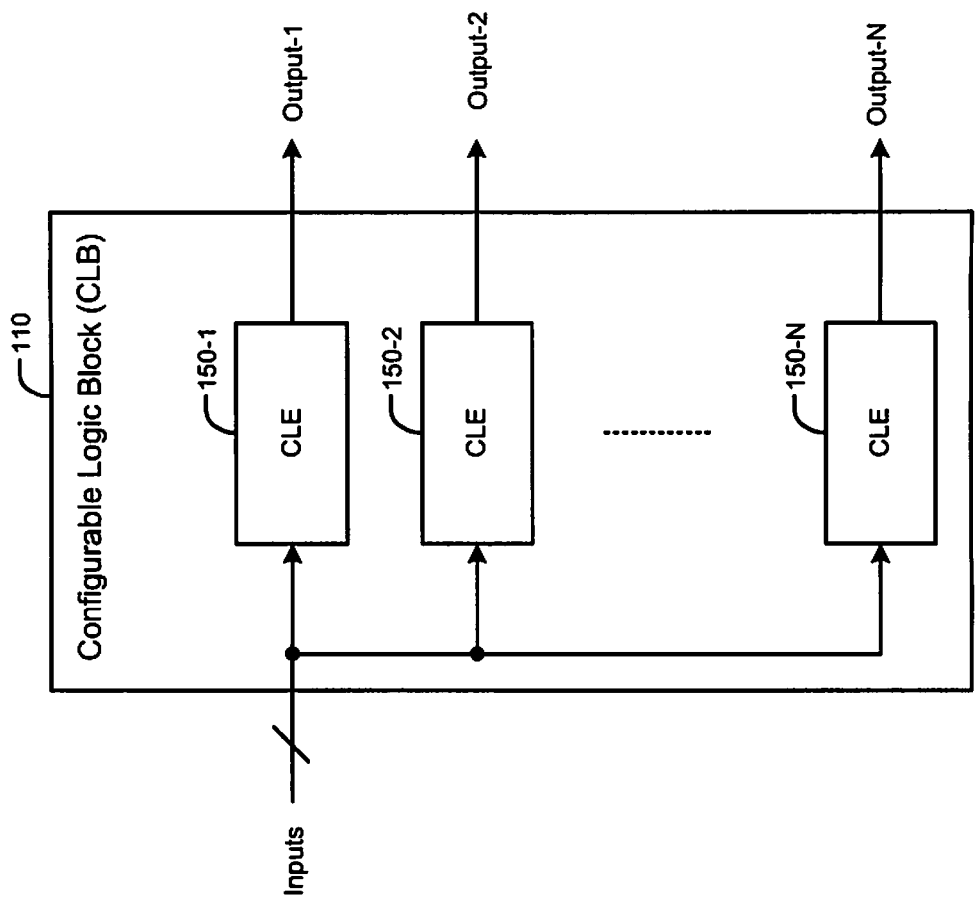
FIG. 2B is a functional block diagram of an exemplary CLB according to the prior art.
Figure 3A:
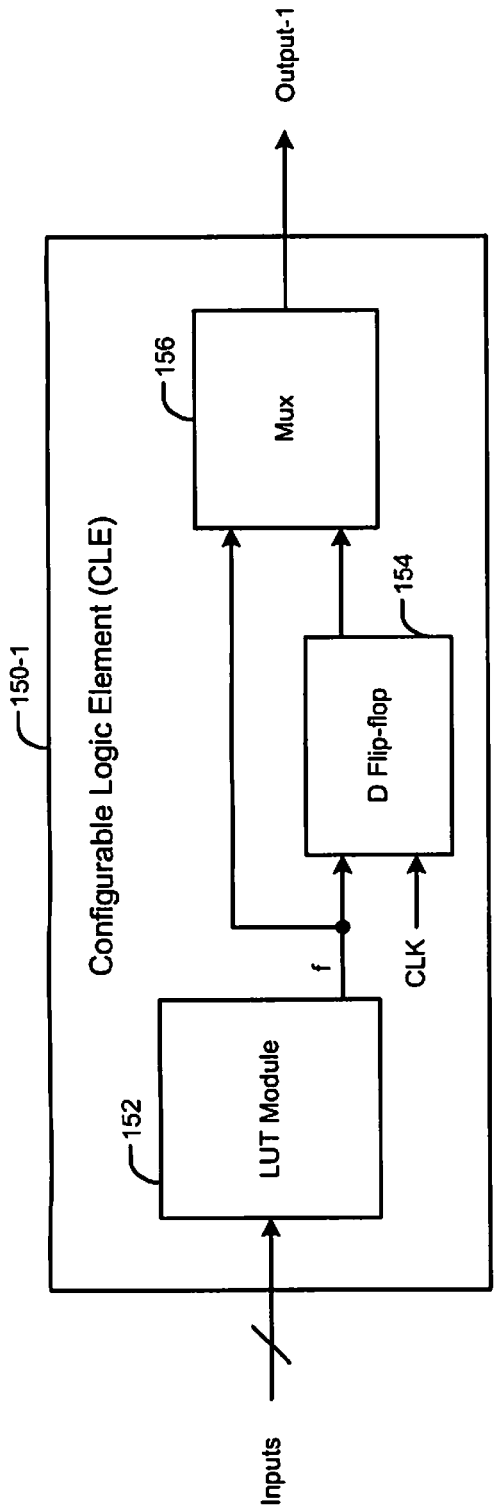
FIG. 3A is a functional block diagram of an exemplary configurable logic element (CLE) of a CLB according to the prior art.
Figure 3B:
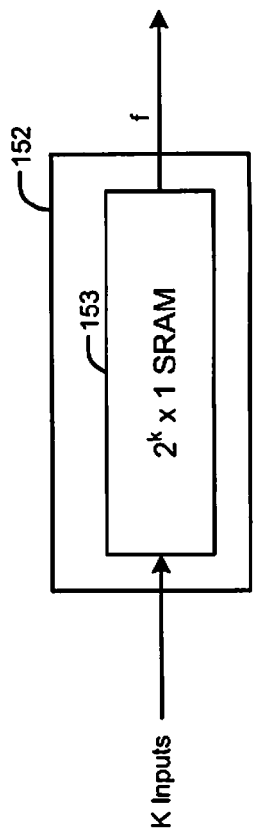
FIG. 3B is a functional block diagram of a lookup table module used as a CLE according to the prior art.
Figure 3C:
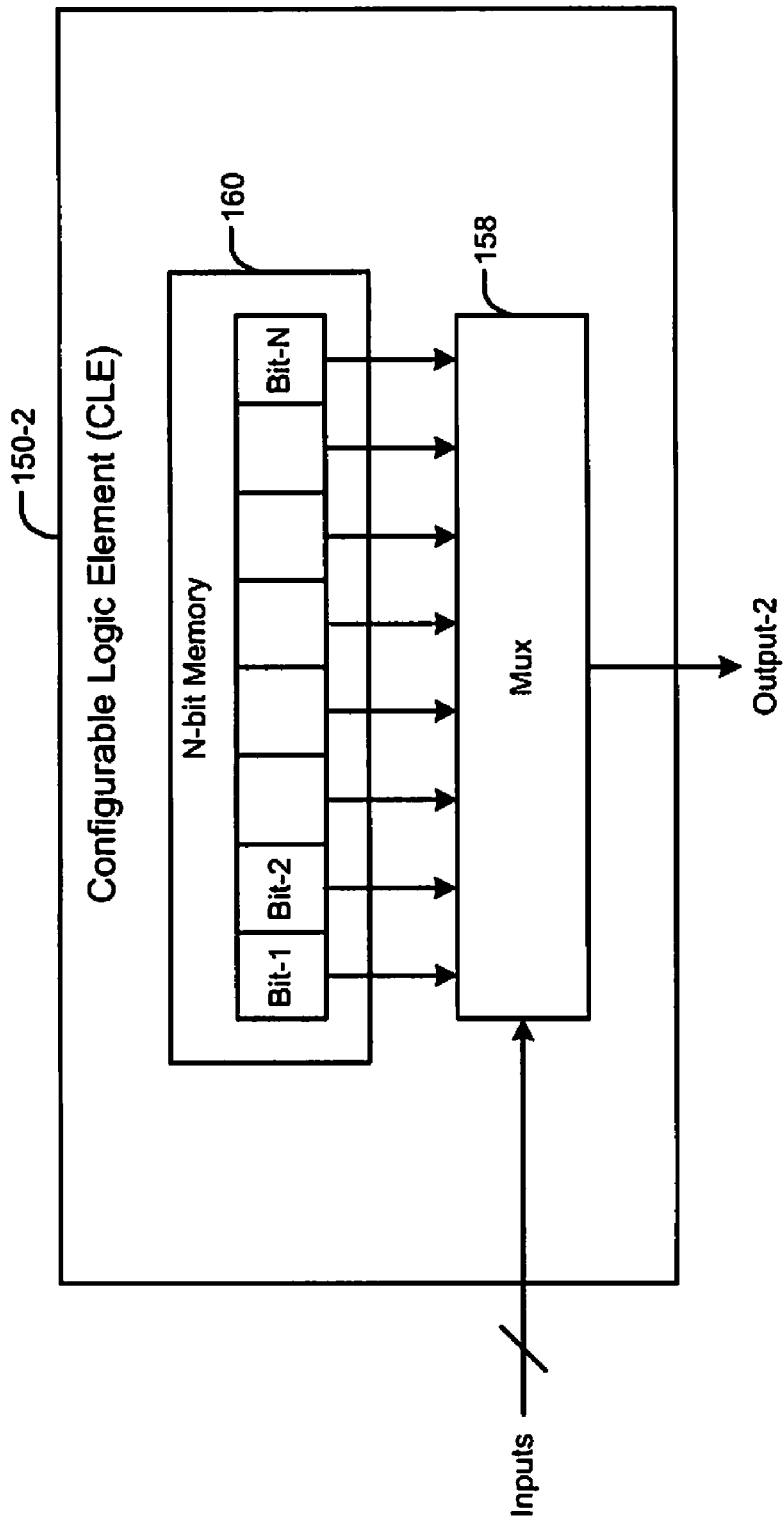
FIG. 3C is a functional block diagram of a multiplexer module used as a CLE according to the prior art.
Figure 4A:
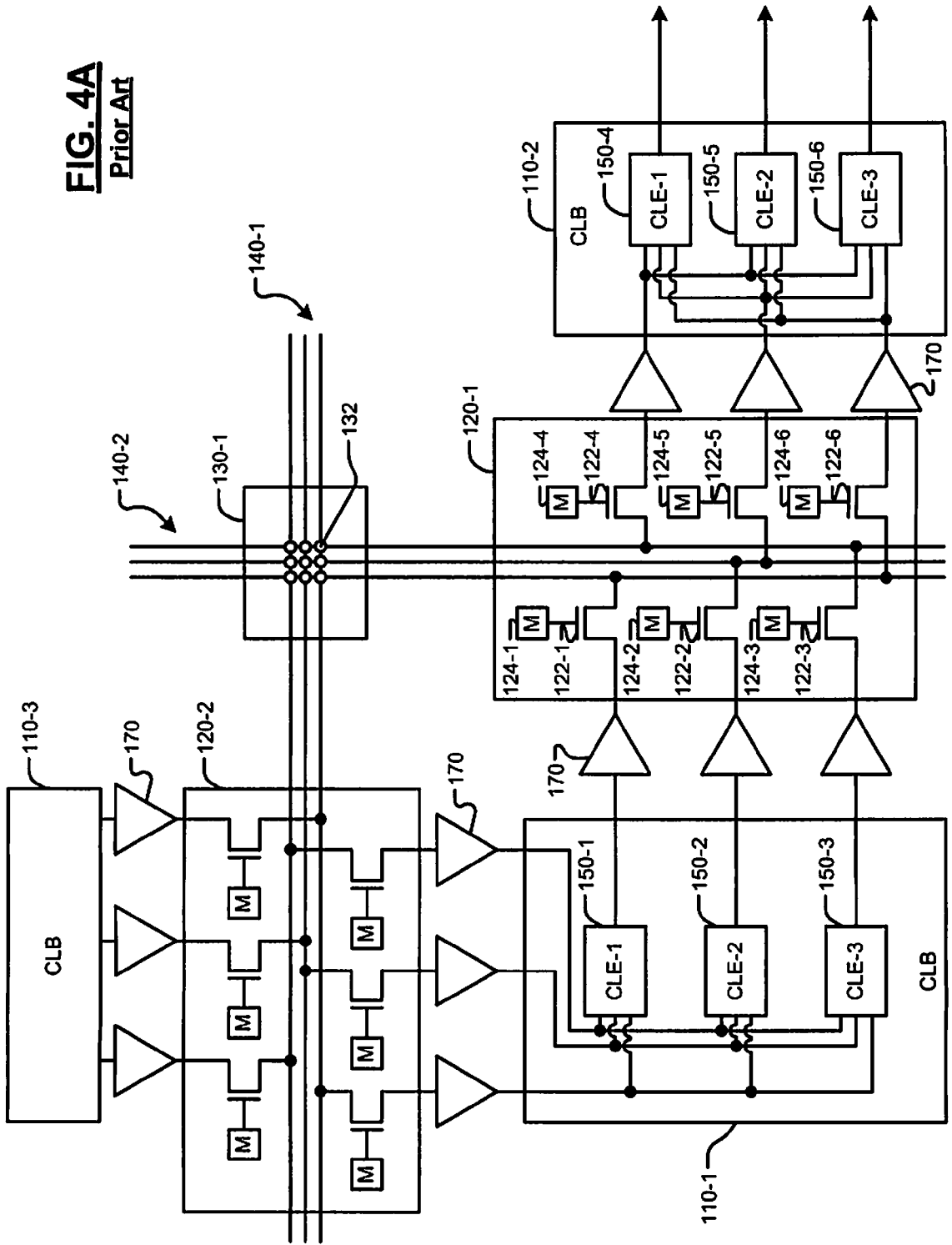
FIG. 4A is a functional block diagram depicting programmable interconnections in a FPGA according to the prior art.
Figure 4B:
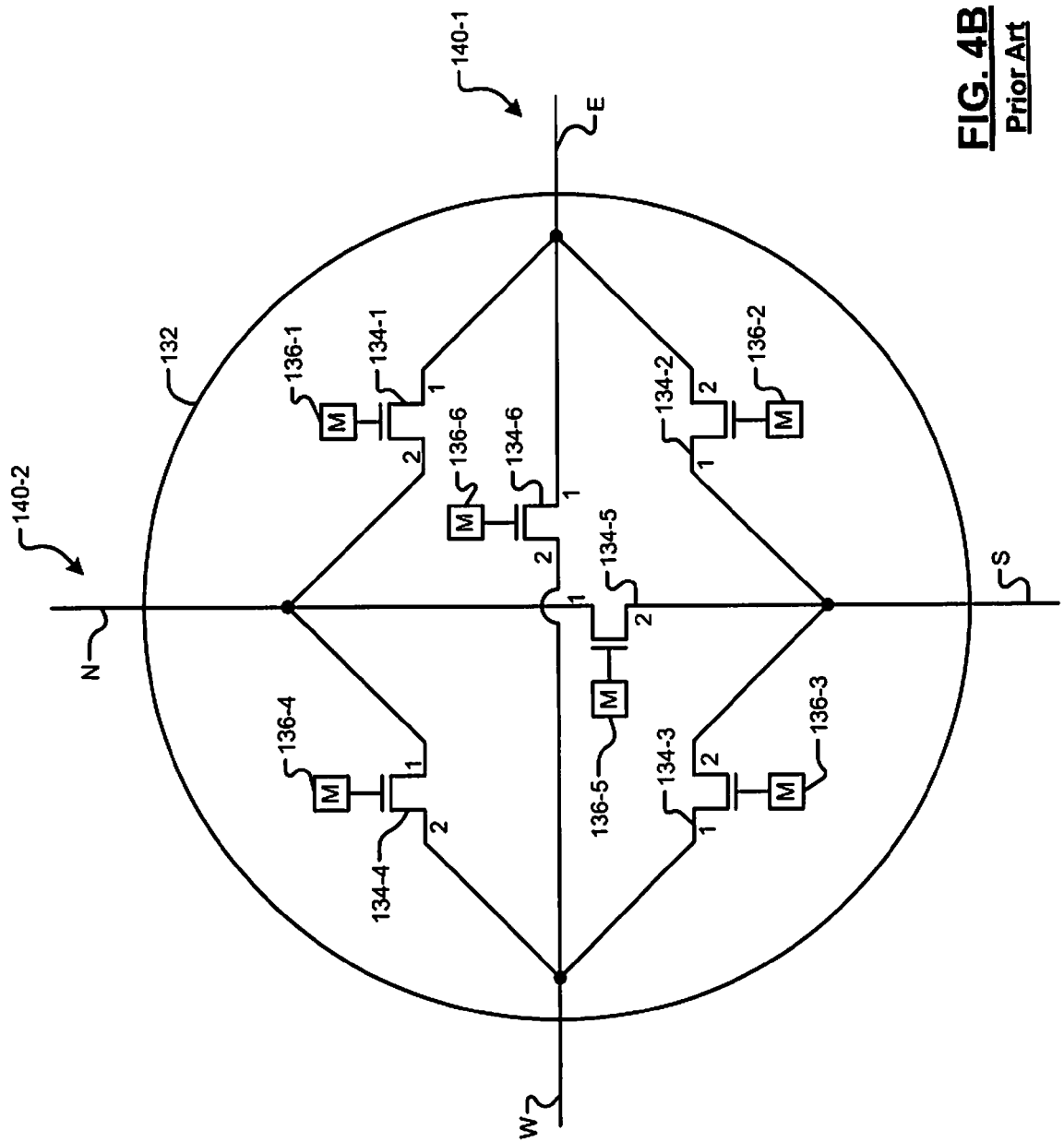
FIG. 4B is a functional block diagram of a segment connection switch according to the prior art.

The following description is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

Using memory cells, such as static random access memory (SRAM) memory cells, to control pass-gate transistors in field-programmable gate arrays (FPGAs) typically consumes a large area and power in integrated circuits (ICs). Therefore, in accordance with one embodiment, the SRAM memory cells and pass-gate transistors are replaced by memory cells of charge-based memory to reduce the amount of power and/or area required by the memory cells. The charge-based memory may include ballistic-charge injection memory and flash memory. Alternatively, the SRAM memory cells and pass-gate transistors may be replaced by cells of phase-change memory. Exemplary memory cells and arrays disclosed in U.S. Pat. Nos. 6,958,516, 7,015,102, 7,115,942, and 7,180,125, which are incorporated herein by reference in their entirety.

Figure 5A:
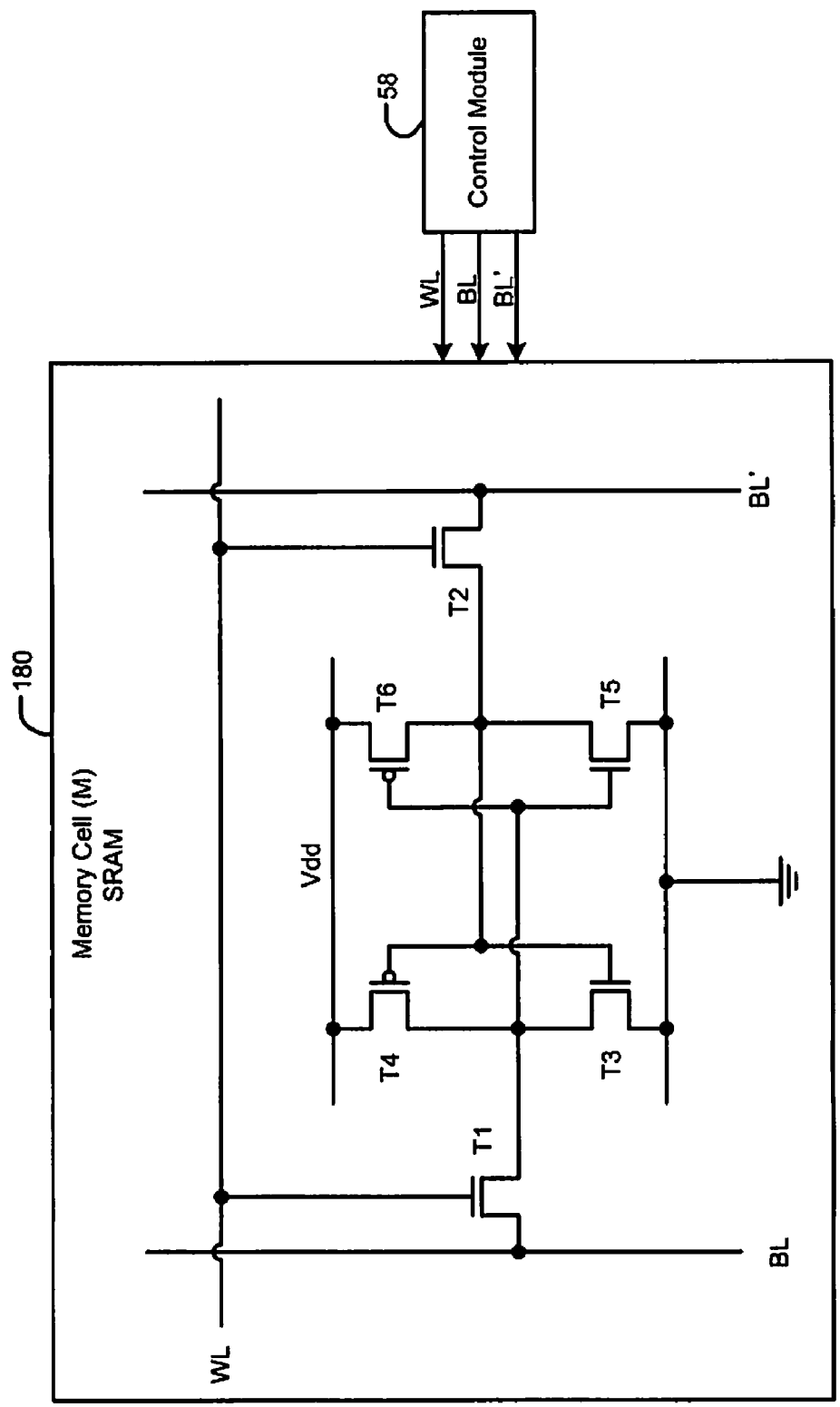
FIG. 5A is a schematic of an exemplary static random access memory (SRAM) cell according to the prior art.
Figure 5B:
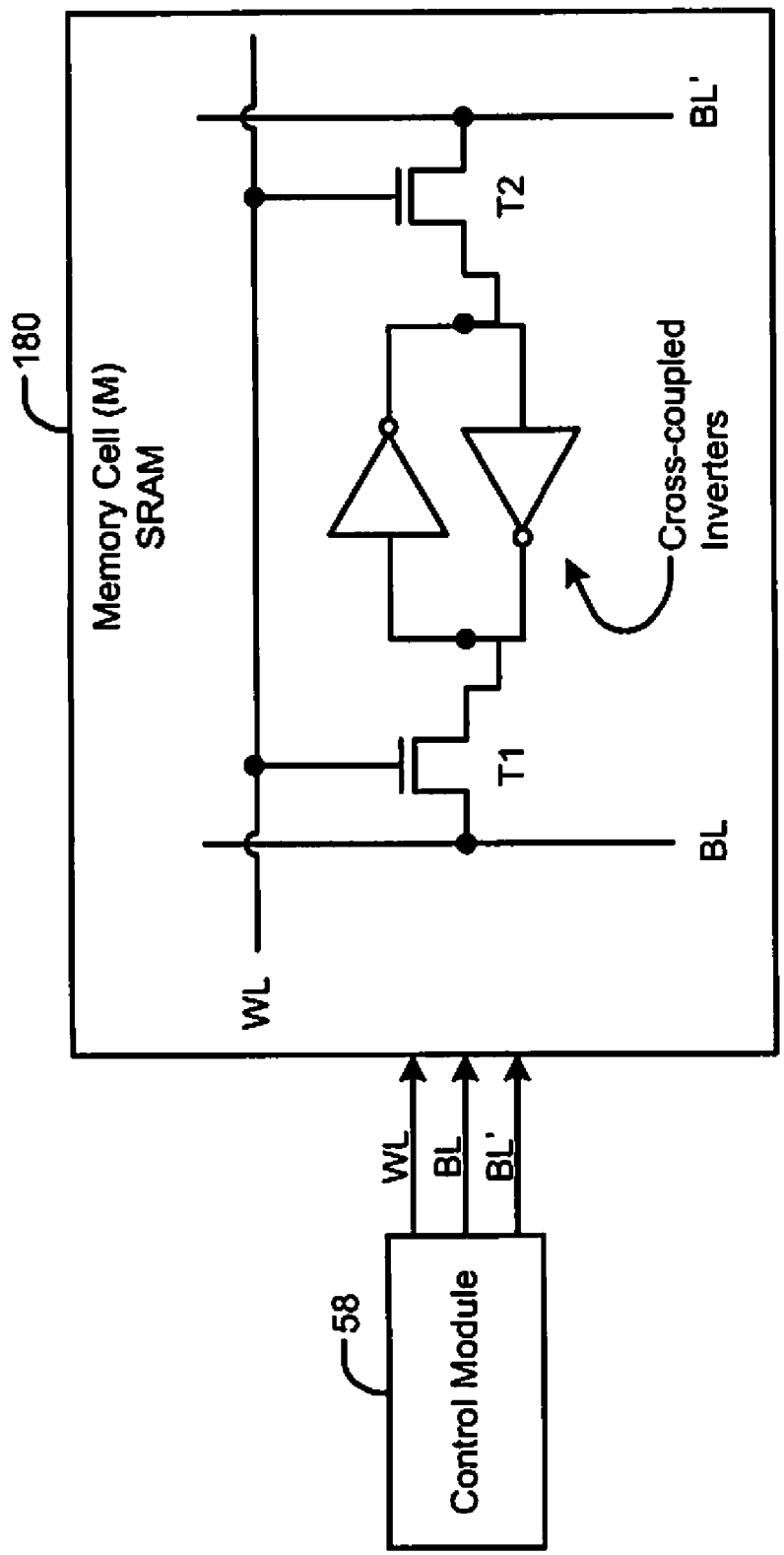
FIG. 5B is a schematic of an exemplary SRAM cell according to the prior art.

Using charge-based memory (or phase-change memory) instead of SRAM memory cells and pass-gate transistors may offer several benefits. Charge-based memory is non-volatile, which eliminates the need to reprogram FPGAs every time power is applied to FPGAs. Memory cells of the charge-based memory can perform the function of pass-gate transistors, which eliminates the need for separate pass-gate transistors (e.g., access transistors T1, T2 of FIG. 5A) in addition to memory cells. Memory cells of charge-based memory occupy less area relative to the area typically occupied by SRAM memory cells and pass-gate transistors. In addition, charge-based memory generally operates at much lower voltages than SRAM memory, which may simplify design and decrease power consumption in ICs.

Figure 6A:
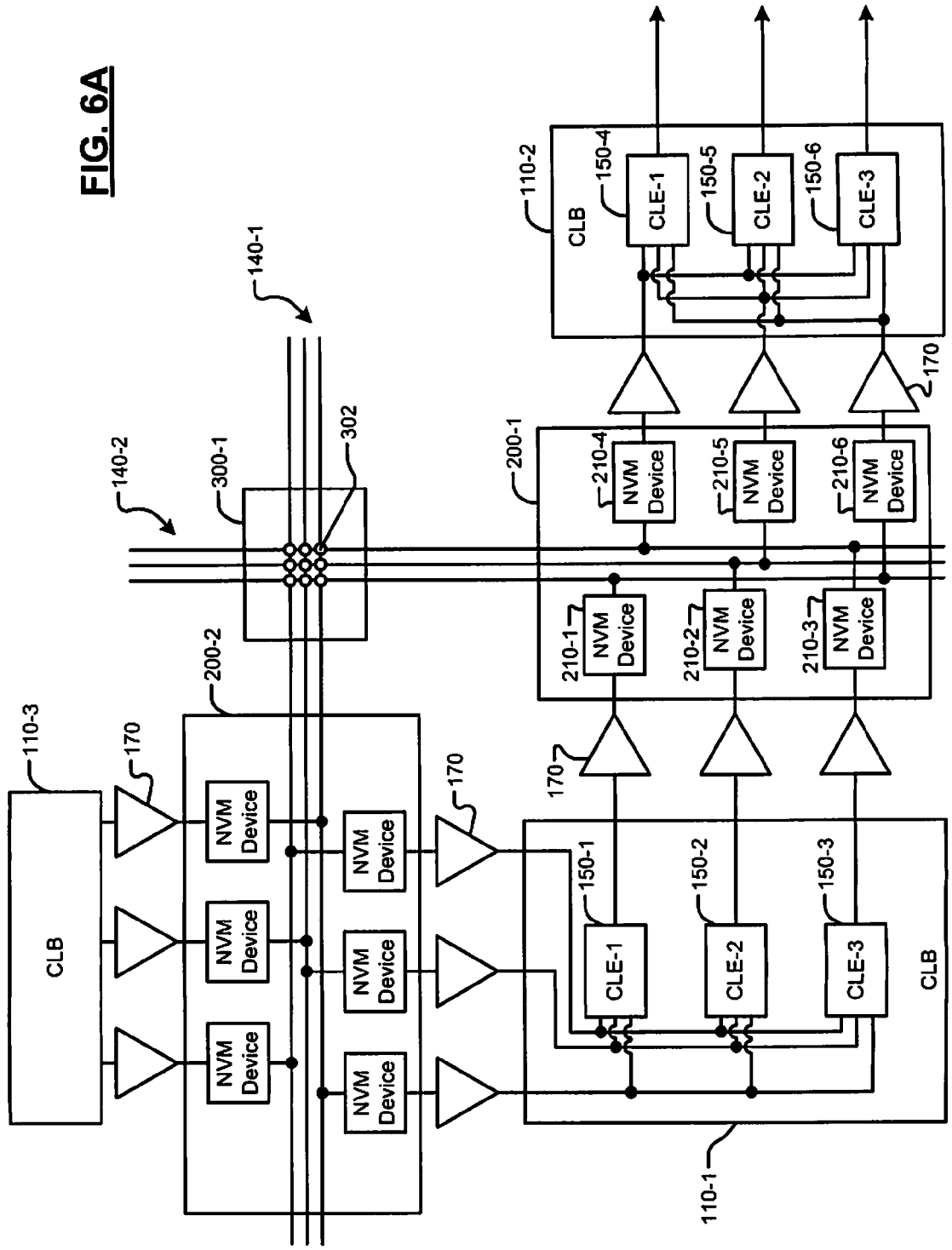
FIG. 6A is a functional block diagram depicting programmable interconnections in an array of CLBs.
Figure 6B:
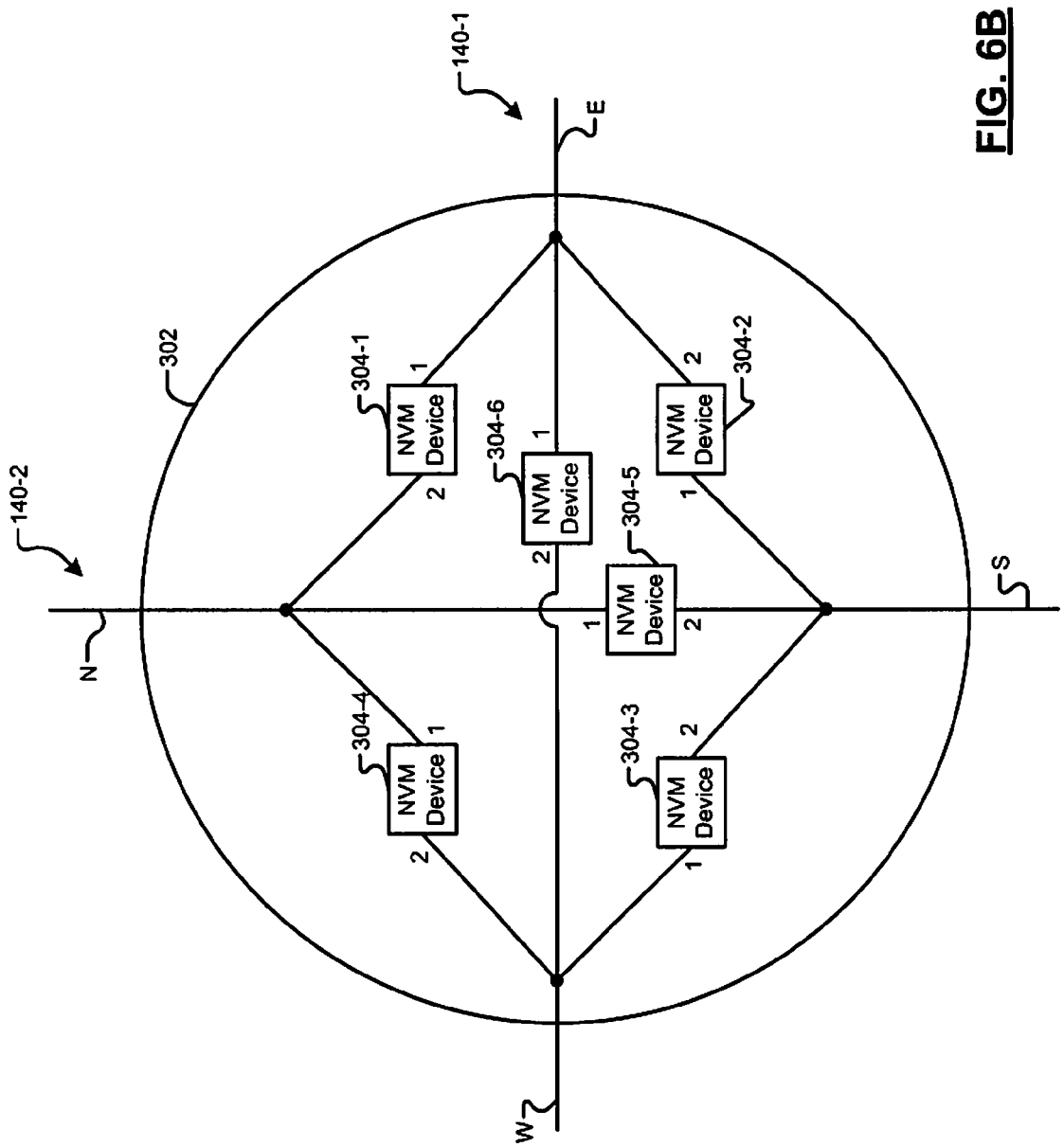
FIG. 6B is a functional block diagram of a segment connection switch.
Figure 7A:
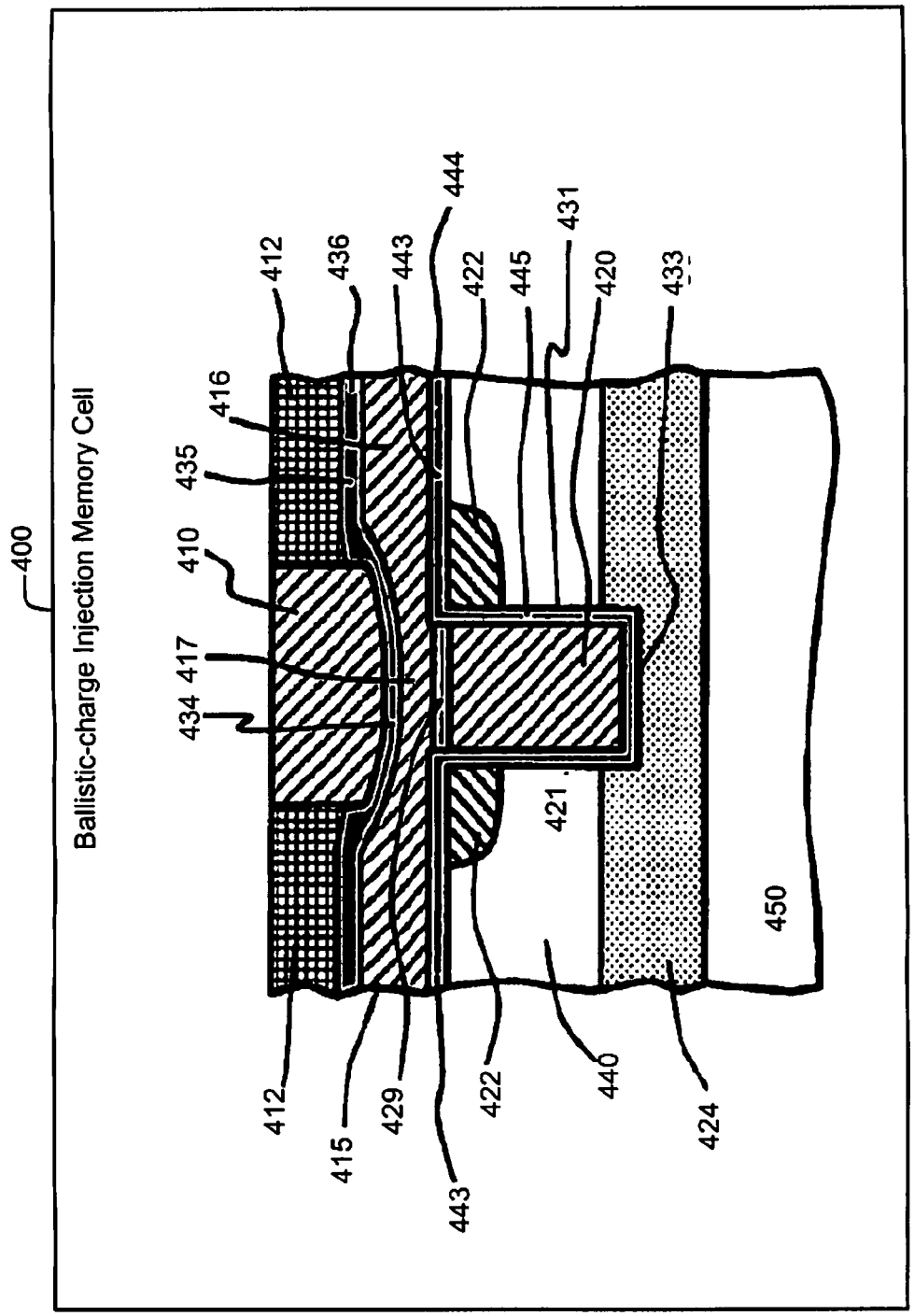
FIG. 7A depicts a semiconductor layout of an exemplary memory cell of ballistic-charge injection memory.
Figure 7B:
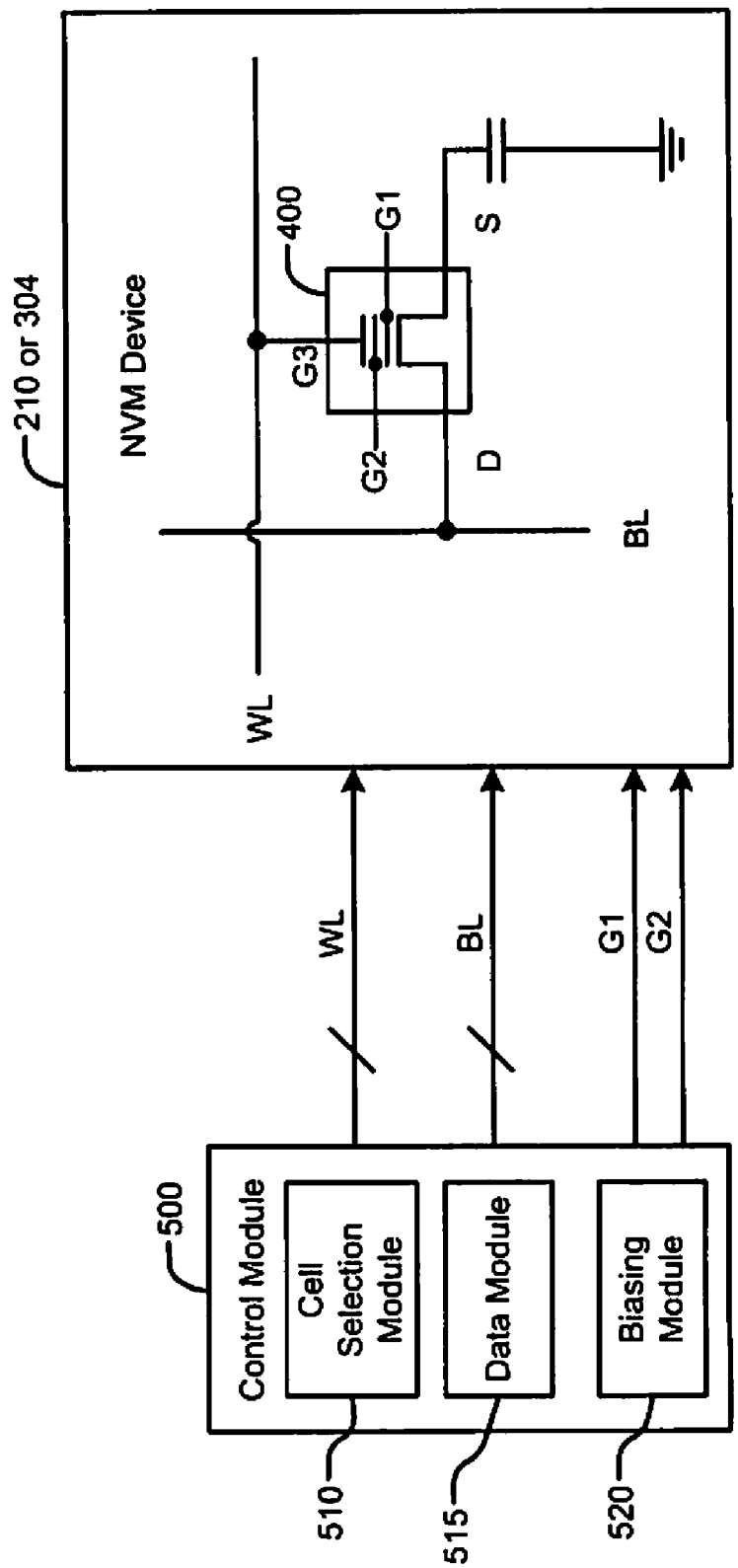
FIG. 7B is a functional block diagram of a nonvolatile memory (NVM) device comprising the memory cell of FIG. 7A used to program interconnections in a FPGA.
Figure 8A:
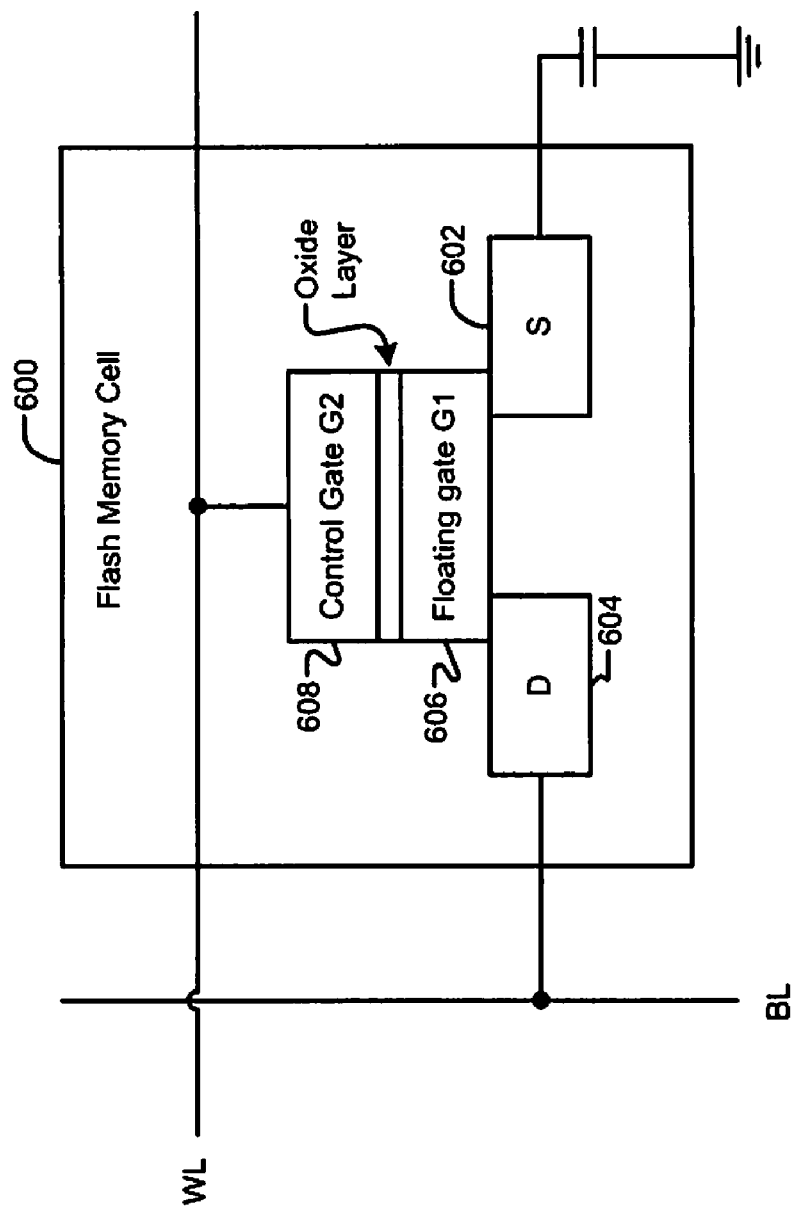
FIG. 8A is a functional block diagram of an exemplary flash memory cell.
Figure 8B:
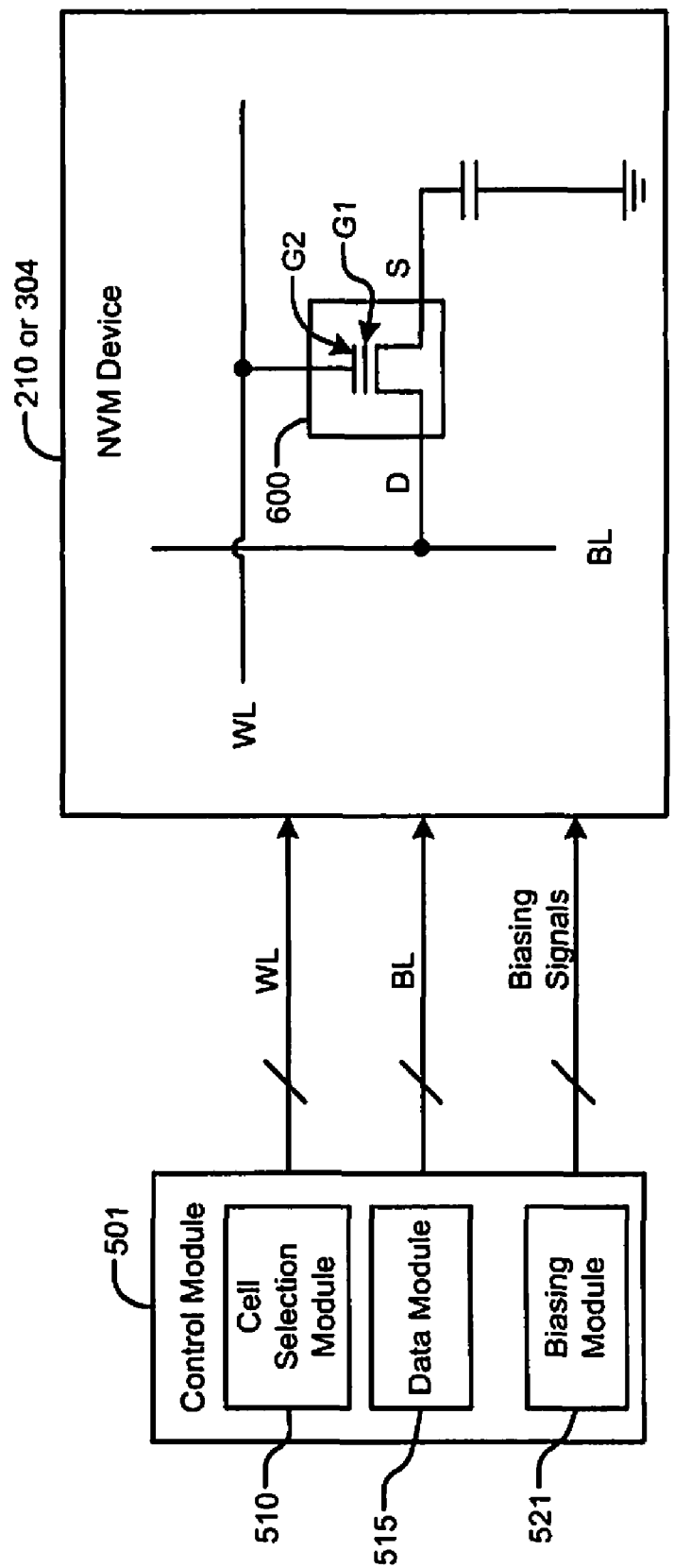
FIG. 8B is a functional block diagram of a NVM device comprising the memory cell of FIG. 8A used to program interconnections in a FPGA.
Figure 9A:
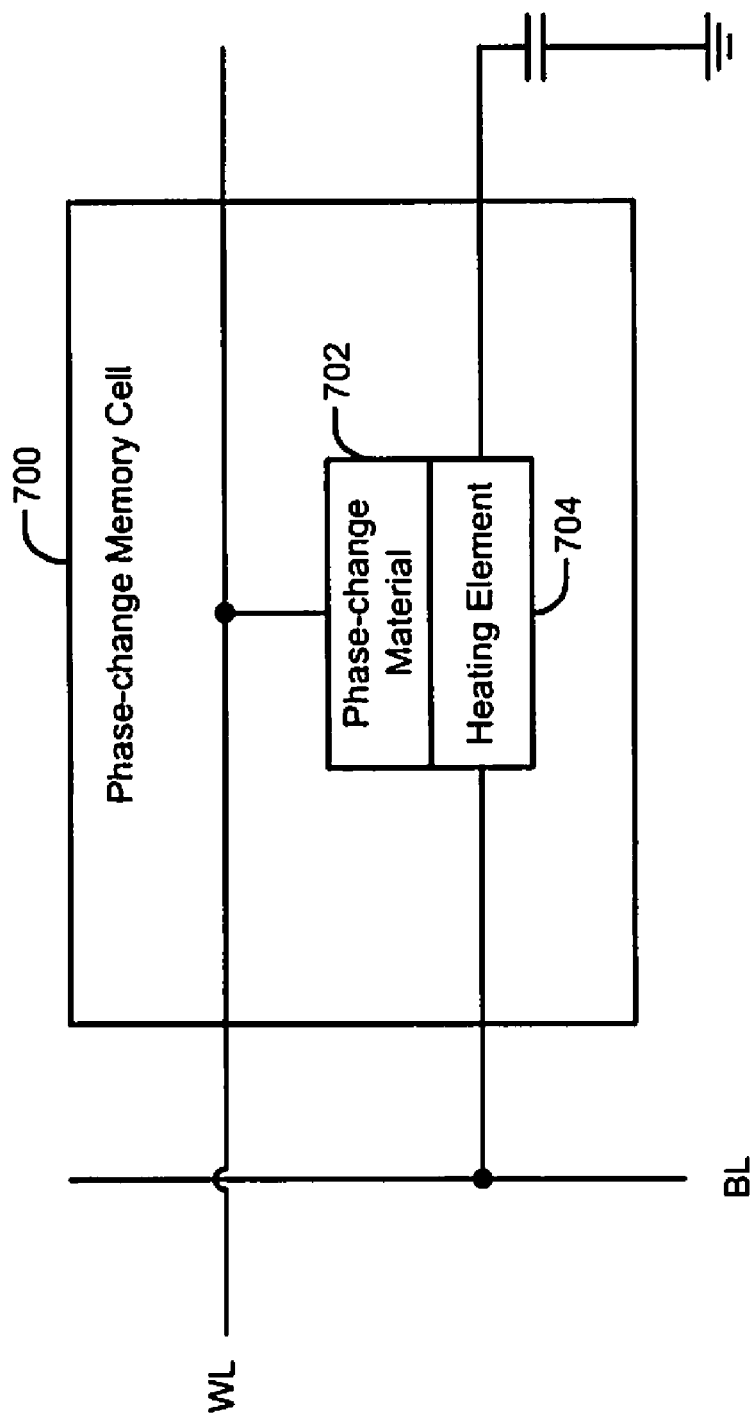
FIG. 9A is a functional block diagram of an exemplary phase-change memory cell.
Figure 9B:
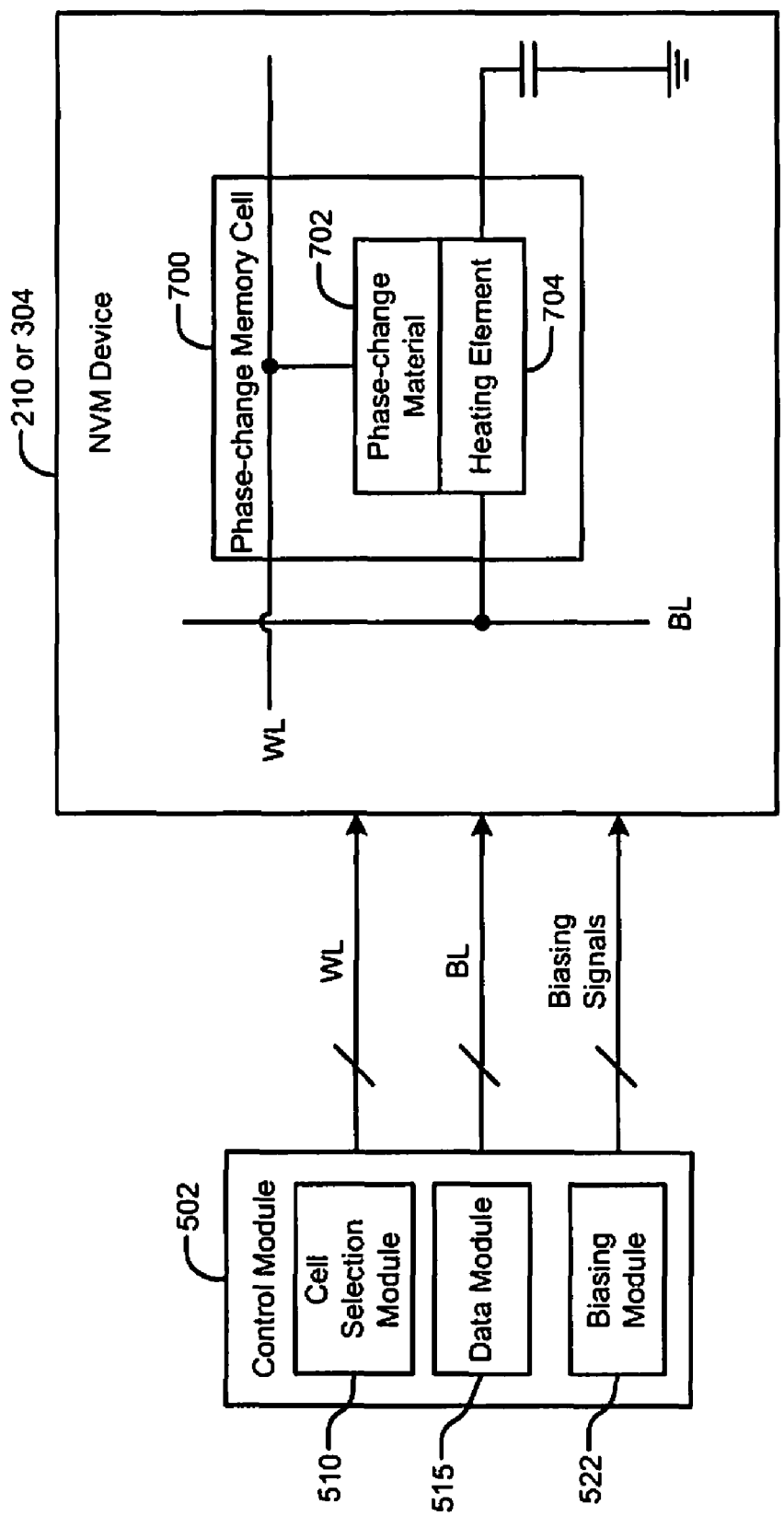
FIG. 9B is a functional block diagram of a NVM device comprising the memory cell of FIG. 9A used to program interconnections in a FPGA.

Before a detailed discussion is presented, a brief description of drawings is presented. FIGS. 6A and 6B show programmable interconnections in FPGAs wherein connection switches and routing switches may utilize memory cells of charge-based memory or phase-change memory to interconnect configurable logic blocks (CLBs). FIGS. 7A and 7B show a memory cell of ballistic-charge injection memory that may be used in the connection switches and the segment connection switches. FIGS. 8A and 8B show a memory cell of flash memory that may be used in the connection switches and the segment connection switches. FIGS. 9A and 9B show a memory cell of phase-change memory that may be used in the connection switches and the segment connection switches.

Referring now to FIG. 6A, an example of programmable interconnections utilizing memory cells of charge-based memory or phase-change memory to interconnect CLBs is shown. A connection switch C 200-1 may communicate with the wiring segment 140-2 and may connect outputs of the CLB 110-1 to inputs of the CLB 110-2. A connection switch C 200-2 may communicate with the wiring segment 140-1 and may connect outputs of the CLB 110-3 to the inputs of the CLB 110-1. Connection switches C 200-1, 200-2 (collectively connection switches 200) that interconnect CLBs 110-1, 100-2, 110-3 (collectively CLBs 110) may utilize nonvolatile memory (NVM) devices, where each NVM device includes a memory cell of a charge-based memory, flash memory, phase-change memory, or the like.

As an example, the CLB 110-1 is shown to comprise three CLEs 150, namely, CLE1 150-1, CLE-2 150-2, and CLE-3 150-3. The CLB 110-2 is also shown to comprise three CLEs 150, namely, CLE-1 150-4, CLE-2 150-5, and CLE-3 150-6. Similarly, the CLB 110-3 may comprise three CLEs 150 (not shown). Each of CLE-1 150-1, CLE-2 150-2, and CLE-3 150-3 receives three inputs and generates one output. Each of CLE-1 150-4, CLE-2 150-5, and CLE3 150-6 receives three inputs and generates one output. The inputs and outputs of CLBs 110-1, 110-2, 110-3 may be buffered by line buffers 170.

Since each CLE 150 has three inputs and each CLB 110 has three outputs, each connection switch C 200 is shown to comprise six NVM devices. For example, the connection switch C 200-1 comprises NVM devices 210-1 through 210-6 (collectively NVM devices 210). Each NVM device 210 may be programmed to one of at least first and second states. The first and second states may be 1 and 0 (or 0 and 1), respectively. A control module in the FPGA (not shown) may generate signals that address and program the NVM devices 210.

The NVM devices 210 may have an input and an output (also called first and second ends, respectively). When programmed to one of the two states, the NVM devices 210 may function as pass-gate transistors that are turned on and that communicate the input to the output. On the other hand, when programmed to the other of the two states, the NVM devices 210 may function as pass-gate transistors that are turned off and that do not communicate the input to the output. Depending on the programming of the NVM devices 210, the connection switch C 200-1 may or may not connect the outputs of the CLB 110-1 to the inputs of the CLB 110-2.

Specifically, the outputs of CLE-1 150-1, CLE-2 150-2, CLE-3 150-3 respectively communicate with the first ends of NVM devices 210-1, 210-2, 210-3. The inputs of CLE-1 150-4, CLE-2 150-5, and CLE-3 150-6 respectively communicate with the first ends of NVM devices 210-4, 210-5, 210-6. The second ends of the NVM devices 210 are connected to wires in the wiring segment 140-2 as shown.

When the NVM devices 210-1, 210-6 are programmed to function as pass-gate transistors that are turned on, the output of CLE-1 150-1 is connected to the inputs of CLE-1 150-4, CLE-2 150-5, and CLE-3 150-6. When the NVM devices 210-2, 210-5 are programmed to function as pass-gate transistors that are turned on, the output of CLE-2 150-2 is connected to the inputs of CLE-1 150-4, CLE-2 150-5, and CLE-3 150-6. When the NVM devices 210-3, 210-4 are programmed to function as pass-gate transistors that are turned on, the output of CLE-3 150-3 is connected to the inputs of CLE-1 150-4, CLE-2 150-5, and CLE-3 150-6.

Additionally, a routing switch S 300-1 may route the outputs of the CLB 110-1 to the inputs of other CLBs 110, the IOBs 54, etc. via the wiring segments 140-2, 140-1. The routing switch S 300-1 may also route outputs of other CLBs 110, the IOBs 54, etc. to the inputs of CLB 110-2 via the wiring segments 140-2, 140-1. For example, the routing switch S 300-1 may route outputs of the CLB 110-3 to the inputs of the CLB 110-2 via the wiring segments 140-1, 140-2.

Specifically, the routing switch 300-1 may comprise a plurality of segment connection switches 302. The number of segment connection switches 302 may depend on the number of wires in the wiring segments 140-1, 140-2, which, in turn, may depend on the number of inputs and outputs of the CLBs 110. For example, since each of the CLBs 110-1, 110-2, 110-3 is shown to have three inputs and three outputs, each of the wiring segments 140-1, 140-2 comprises three wires. Accordingly, the routing switch 300-1 is shown to comprise a total of (3×3)=9 segment connection switches 302.

Referring now to FIG. 6B, (in one embodiment) the segment connection switch 302 comprises six NVM devices 304-1 through 304-6 (collectively NVM devices 304). Each NVM device 304 may be programmed to one of at least first and second states. The first and second states may be 1 and 0 (or 0 and 1), respectively. The control module in the FPGA (not shown) may generate signals that address and program the NVM devices 304.

When programmed to one of the two states, an NVM device 304 may function as a pass-gate transistor that is turned on and that communicates an input of the NVM device to an output of the NVM device. On the other hand, when programmed to the other of the two states, an NVM device 304 may function as a pass-gate transistor that is turned off and, therefore, does not communicate an input of the NVM device to an output of the NVM device.

The NVM devices 304 may have an input and an output (also called first and second ends, respectively). Wires in the wiring segment 140-1 may have east (E) and west (W) ends. Wires in the wiring segment 140-2 may have north (N) and south (S) ends. The first ends of NVM devices 304-1, 304-6 and the second end of the NVM device 304-2 may be connected to the east (E) end of the wire in the wiring segment 140-1. The second end of the NVM device 304-1 and the first ends of NVM devices 304-4, 304-5 may be connected to the north (N) end of the wire in the wiring segment 140-2. The second ends of NVM devices 304-4, 304-6 and the first end of the NVM device 304-3 may be connected to the west (W) end of the wire in the wiring segment 140-1. The second ends of NVM devices 304-3, 304-5 and the first end of the NVM device 304-2 may be connected to the south (S) end of the wire in the wiring segment 140-2.

When the NVM device 304-1 is programmed to function as a pass-gate transistor that is turned on, the east (E) end of the wire in the wiring segment 140-1 is connected to the north (N) end of the wire in the wiring segment 140-2. When the NVM device 304-2 is programmed to function as a pass-gate transistor that is turned on, the east (E) end of the wire in the wiring segment 140-1 is connected to the south (S) end of the wire in the wiring segment 140-2.

When the NVM device 304-3 is programmed to function as a pass-gate transistor that is turned on, the south (S) end of the wire in the wiring segment 140-2 is connected to a west (W) end of a wire in the wiring segment 140-1. When the NVM device 304-4 is programmed to function as a pass-gate transistor that is turned on, the west (W) end of the wire in the wiring segment 140-1 is connected to the north (N) end of the wire in the wiring segment 140-2.

When the NVM device 304-5 is programmed to function as a pass-gate transistor that is turned on, the south (S) end of the wire in the wiring segment 140-2 is connected to the north (N) end of the wire in the wiring segment 140-2. When the NVM device 304-6 is programmed to function as a pass-gate transistor that is turned on, the east (E) end of the wire in the wiring segment 140-1 is connected to the west (W) end of the wire in the wiring segment 140-1.

In general, depending on the connections provided by the connection switches C 200 and the routing switches S 300-1 in the CLB array, outputs of any of the CLBs 110, IOBs 54, etc. may communicate with inputs of any of the CLBs 110, IOBs 54, etc.

Each of the NVM devices 210, 304 may comprise a memory cell of ballistic-charge injection memory, flash memory, or phase-change memory. Referring now to FIG. 7A, an example of the memory cell 400 of ballistic-charge injection memory is shown. The memory cell 400 may include one or more of the exemplary memory cells and arrays disclosed in U.S. Pat. Nos. 6,958,516, 7,015,102, 7,115,942, and 7,180,125. The memory cell 400 is an exemplary single-transistor memory cell comprising a source S 424, a drain D 422, and three gates. The three gates may include a floating gate G1 420, a tunneling gate G2 410, and a control gate G3 415.

More specifically, the memory cell 400 may comprise a bulk material 450. The bulk material 450 may include an insulator or a semiconductor having a first type conductivity (e.g., p-type conductivity) with low-level doping. On the bulk material 450 is a first layer 440 of semiconductor having the first type conductivity with a higher doping level than the bulk material 450. A heavily doped first region 424 of a second type conductivity (e.g., n-type conductivity) is embedded between the bulk material 450 and the first layer 440. The first region 424 forms the source S 424 of the memory cell 400. The first layer 440 forms a memory well region 440 wherein the individual memory cell resides.

In the memory well region 440, a heavily doped second region 422 of the second type conductivity is formed adjacent to the memory well region 440. The second region 422 forms the drain D 422 of the memory cell 400. A trench hole with a trench sidewall 431 extends through the drain D 422 and the memory well region 440. A trench bottom 433 may reside in the source region S 424. A channel region 421 is formed along the trench sidewall 431 between the drain region D 422 and the source region S 424.

A first insulation layer 444 is disposed over the memory well region 440, the drain region D 422, the source region S 424, and the trench bottom 433. The first insulation layer 444 includes a first portion 443 that is disposed over the memory well region 440 and the drain region D 422. A second portion 445 of the first insulation layer 444 is disposed adjacent to the trench sidewall 431 and over the trench bottom 433.

The floating gate G1 420 is provided within the trench hole and is insulated from the regions of the drain D 422, the memory well region 440, and the source S 424 by the first insulation layer 444. A second insulation layer 429 is disposed over the floating gate G1 420. The control gate G3 415 is disposed over the first and second insulation layers 444, 429. The control gate G3 415 may comprise a heavily doped polycrystalline silicon, a low-resistivity interconnect material, or a refractory metal. In some implementations, the control gate G3 415 may comprise two portions. A first portion 416 may be disposed over the first portion 443 of the first insulation layer 444. A second portion 417 may be disposed over the second insulation layer 429.

A third insulation layer 436 includes a first portion 435 that is disposed over the first portion 416 of the control gate G3 415. A second portion 434 of the third insulation layer 436 is disposed over the second portion 417 of the control gate G3 415. A tunneling gate G2 410 is provided atop the second portion 434 of the third insulation layer 436. The tunneling gate G2 410 may comprise a heavily doped polycrystalline silicon, a low-resistivity interconnect material, or a refractory metal. A fourth insulation layer 412 is disposed over the first portion 435 of the third insulation layer 436.

Referring now to FIG. 7B, an NVM device 210, 304 is shown comprising the memory cell 400. A control module 500 in the FPGA may generate signals that address and program the memory cell 400. Specifically, (in one embodiment) the control module 500 may include a cell selection module 510, a data module 515, and a biasing module 520. The cell selection module 510 may generate signals such as word line (WL). WL may select the memory cell 400 for programming. The data module 515 may generate signals such as bit line (BL). BL may communicate data (e.g., a 1 or a 0) to be written in the memory cell 400. The biasing module 520 may generate biasing signals that bias one or more of the three gates G1 420, G2 410, and G3 415.

Specifically, when the cell selection module 510 selects the memory cell 400 for programming (e.g., to write a 1), ballistic charges of a first type (e.g., electrons) may be injected into the floating gate G1 420 as follows. The biasing module 520 may generate a first biasing signal, which may be WL, having a voltage of approximately 2V that is applied to the control gate G3 415. The biasing module 520 may generate a second biasing signal having a voltage of approximately −2.1V to −2.5V that is applied to the tunneling gate G2 410. The biasing module 520 may generate a third biasing signal having a voltage of approximately 0V to 0.9V that is applied to the floating gate G1 420. Electrons emanated from the tunneling gate G2 410 are transported through the control gate G3 415 to the floating gate G1 420. A 0 may be written in the memory cell 400 by reversing polarities of the biasing signals.

When a plurality of memory cells 400 are arranged in rows and columns, the biasing module 520 may generate biasing signals that hold the source S 424, the drain D 422, and the control gate G3 415 of memory cells 400 that are not selected for programming at ground potential (e.g., 0V). Thus, only memory cell 400s that are selected for programming is programmed. The control module 500 may include row and column address decoders, sense amplifiers, buffers (all not shown), etc.

Referring now to FIG. 8A, an example flash memory cell 600 is shown. In one embodiment, the flash memory cell 600 comprises a source S 602, a drain D 604, a floating gate G1 606, and a control gate G2 608. The floating gate G1 606 and the control gate G2 608 are separated by a thin oxide layer. A 1 or a 0 may be stored in the memory cell 600 by storing two different levels of charge on the floating gate G1 606. For example, a 0 may be stored when charge is transferred to the floating gate G1 606 by injecting electrons through the thin oxide layer, and a 1 may be stored when charge is transferred from the floating gate G1 606 by tunneling.

Referring now to FIG. 8B, an NVM device 210, 304 is shown comprising the flash memory cell 600. A control module 501 in the FPGA may generate signals that address and program the flash memory cell 600. Specifically, (in one embodiment) the control module 501 may include cell selection module 510, data module 515, and a biasing module 521. The cell selection module 510 may generate signals such as word line (WL). WL may select the memory cell 600 for programming. The data module 515 may generate signals such as bit line (BL). BL may communicate the data (e.g., a 1 or a 0) that is to be written in the memory cell 600. The biasing module 521 may generate biasing signals that bias the source S 602 and the drain D 604.

For example, when writing a 0 to the memory cell 600, the cell selection module 510 may generate WL that applies a high voltage to the control gate G2 608. Additionally, the data module 515 may generate BL that applies a high voltage to the drain D 604, and the bias module 521 may generate a first biasing signal that biases the source S 602 to ground potential (or low voltage). Electrons generated by the source-drain potential are injected through the thin oxide layer to the floating gate G1 606.

When writing a 1, the quantity of electrons in the floating gate G1 606 is decreased as follows. The cell selection module 510 may generate WL that grounds the control gate G2 608. Additionally, the biasing module 521 may generate a second biasing signal that floats the drain D 604 and a third biasing signal that applies a high voltage to the source S 602. Tunneling transfers electrons from the floating gate G1 606.

A plurality of flash memory cells 600 may be arranged in rows and columns. The control module 501 may include row and column address decoders, sense amplifiers, buffers (all not shown), etc. that can address and program only the memory cells that are selected for programming.

Referring now to FIG. 9A, an example of a phase-change memory cell 700 is shown. In one embodiment, the phase-change memory cell 700 comprises a phase-change material 702 and a heater element 704. The phase-change material 702 may include chalcogenic glass that changes state from crystalline to amorphous when heated by the heater element 704. The electrical resistance of the phase-change material 702 is higher in the amorphous state than in the crystalline state. Accordingly, the crystalline and amorphous states of the phase-change material 702 may be used to represent a 0 and a 1, respectively.

Referring now to FIG. 9B, an NVM device 210, 304 is shown comprising the phase-change memory cell 700. A control module 502 in the FPGA may generate signals that address and program the phase-change memory cell 700. Specifically, (in one embodiment) the control module 502 may include cell selection module 510, data module 515, and a biasing module 522. The cell selection module 510 may generate signals such as word line (WL). WL may select the memory cell 700 for programming. The data module 515 may generate signals such as bit line (BL). BL may communicate the data (e.g., a 1 or a 0) that is to be written in the memory cell 700. The biasing module 522 may generate biasing signals that bias the heater element 704.

A plurality of phase-change memory cells 700 may be arranged in rows and columns. The control module 502 may include row and column address decoders, sense amplifiers, buffers (all not shown), etc. that can address and program only the memory cells that are selected for programming.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A field-programmable gate-array (FPGA) comprising:
a first memory cell having (i) a plurality of states, (ii) a first end, and (iii) a second end;
a first configurable logic block (CLB) having an output directly coupled to the first end of the first memory cell;
a second memory cell having (i) a plurality of states, (ii) a first end, and (iii) a second end; and
a second CLB having an input directly coupled to the first end of the second memory cell,
wherein the output of the first CLB communicates with the input of the second CLB via (i) a second end of the first memory cell and (ii) the second end of the second memory cell based on (i) the state of the first memory cell and (ii) a state of the second memory cell, and
wherein each of the first memory cell and the second memory cells includes a single-transistor memory cell of nonvolatile memory.

2. The FPGA of claim 1, wherein each of the first memory cell and the second memory cell includes a ballistic-charge injection memory cell.

3. The FPGA of claim 1, wherein each of the first memory cell and the second memory cell includes a phase-change memory cell.

4. The FPGA of claim 1, wherein each of the first memory cell and the second memory cell includes a flash memory cell.

5. The FPGA of claim 1, further comprising a first wiring segment that includes a first conductor, wherein the second end of the first memory cell communicates with the second end of the second memory cell via the first conductor.

6. The FPGA of claim 5, further comprising:
a third memory cell having (i) a plurality of states, (ii) a first end that communicates with the first conductor, and (iii) a second end; and
a third CLB that communicates with the second end of the third memory cell via the first conductor,
wherein the third CLB communicates with at least one of the first CLB and the second CLB via the first conductor and via the third memory cell based on a state of the third memory cell.

7. The FPGA of claim 6, further comprising:
a fourth memory cell having (i) a plurality of states, (ii) a first end that communicates with the first conductor, and (iii) a second end;
a second wiring segment that includes a second conductor, wherein the second conductor communicates with the second end of the fourth memory cell; and
a fourth CLB that communicates with the second end of the fourth memory cell via the second conductor,
wherein the fourth CLB communicates with at least one of the first CLB and the second CLB via (i) the second conductor, (ii) the fourth memory cell, and (iii) the first conductor based on a state of the fourth memory cell.

8. The FPGA of claim 7, further comprising:
a fifth memory cell having a plurality of states, a first end that communicates with the fourth CLB via the second conductor, and a second end; and a fifth CLB that communicates with the second end of the fifth memory cell via the second conductor,
wherein the fifth CLB communicates with the fourth CLB via the second conductor and via the fifth memory cell based on a state of the fifth memory cell.

9. The FPGA of claim 8, further comprising:
a sixth memory cell having a plurality of states, a first end that communicates with the second end of the fifth memory cell, and a second end that communicates with the first end of the fourth memory cell,
wherein the fifth CLB communicates with at least one of the first CLB and the second CLB via (i) the second conductor, (ii) the sixth memory cell, and (iii) the first conductor based on a state of the sixth memory cell.

10. The FPGA of claim 9, further comprising:
a seventh memory cell having (i) a plurality of states, (ii) a first end that communicates with the first end of the sixth memory cell, and (iii) a second end that communicates with the second end of the third memory cell,
wherein the fifth CLB communicates with the third CLB via (i) the second conductor, (ii) the seventh memory cell, and (iii) the first conductor based on a state of the seventh memory cell.

11. The FPGA of claim, 10 further comprising:
an eighth memory cell having (i) a plurality of states, (ii) a first end that communicates with the second end of the third memory cell, and (iii) a second end that communicates with the second end of the fourth memory cell,
wherein the third CLB communicates with the fourth CLB via (i) the first conductor, (ii) the eighth memory cell, and (iii) the second conductor based on a state of the eighth memory cell.

12. The FPGA of claim 11, wherein each of the third, fourth, fifth, sixth, seventh, and eighth memory cells includes the single-transistor memory cell.

13. The FPGA of claim 11, further comprising a control module that generates control signals, wherein the control signals control addressing and biasing of the first, second, third, fourth, fifth, sixth, seventh, and eighth memory cells when the FPGA is programmed.

14. The FPGA of claim 13, further comprising input/output blocks (IOBs) that interface the FPGA to devices that are external to the FPGA.

15. The FPGA of claim 8, wherein the first, second, third, fourth, and fifth CLBs include N configurable logic elements (CLEs), where N is an integer greater than or equal to 1.

16. A method for a field-programmable gate-array (FPGA) comprising:
providing a first memory cell and a second memory cell each respectively having (i) a plurality of states, (ii) a first end, and (iii) a second end, and each respectively including a single-transistor memory cell of non-volatile memory;
providing a first configurable logic block (CLB) having an output;
directly coupling the output of the first CLB to the first end of the first memory cell;
providing a second CLB having an input;
directly coupling the input of the second CLB and to the first end of the second memory cell; and
communicating with the output of the first CLB and the input of the second CLB via (i) the second end of the first memory cell and (ii) the second end of the second memory cell based on (i) a state of the first memory cell and (ii) a state of the second memory cell.

17. The method of claim 16, further comprising providing a ballistic-charge injection memory cell, a phase-change memory cell, or a flash memory cell in each of the first memory cell and the second memory cell.

18. The method of claim 16, further comprising:
providing a first wiring segment having a first conductor; and
communicating with the second end of the first memory cell and the second end of the second memory cell via the first conductor.

19. The method of claim 18, further comprising:
providing a third memory cell having (i) a plurality of states, (ii) a first end, and (iii) a second end;
communicating with the first end of the third memory cell and the first conductor;
providing a third CLB;
communicating with the third CLB and the second end of the third memory cell via the first conductor; and
communicating with the third CLB and at least one of the first CLB and the second CLB via the first conductor and via the third memory cell based on a state of the third memory cell.

20. The method of claim 19, further comprising:
providing a fourth memory cell having (i) a plurality of states, (ii) a first end, and (iii) a second end;
communicating with the first end of the fourth memory cell and the first conductor;
providing a second wiring segment having a second conductor; and
communicating with the second conductor and the second end of the fourth memory cell.

21. The method of claim 20, further comprising:
providing a fourth CLB;
communicating with the fourth CLB and the second end of the fourth memory cell via the second conductor; and
communicating with the fourth CLB and at least one of the first CLB and the second CLB via (i) the second conductor, (ii) the fourth memory cell, and (iii) the first conductor based on a state of the fourth memory cell.

22. The method of claim 21, further comprising:
providing a fifth memory cell having (i) a plurality of states, (ii) a first end, and (iii) a second end;
communicating with the first end of the fifth memory cell and the fourth CLB via the second conductor;
providing a fifth CLB;
communicating with the fifth CLB and the second end of the fifth memory cell via the second conductor; and
communicating with the fourth CLB and the fifth CLB via the second conductor and via the fifth memory cell based on a state of the fifth memory cell.

23. The method of claim 22, further comprising:
providing a sixth memory cell having (i) a plurality of states, (ii) a first end, and (iii) a second end;
communicating with the first end of the sixth memory cell and the second end of the fifth memory cell;
communicating with the second end of the sixth memory cell and the first end of the fourth memory cell; and
communicating with the fifth CLB and at least one of the first CLB and the second CLBs via (i) the second conductor, (ii) the sixth memory cell, and (iii) the first conductor based on a state of the sixth memory cell.

24. The method of claim 23, further comprising:
providing a seventh memory cell having (i) a plurality of states, (ii) a first end, and (iii) a second end;
communicating with the first ends of the sixth memory cell and the seventh memory cell;
communicating with the second ends of the seventh memory cell and the third memory cells; and communicating with the third CLB and the fifth CLB via (i) the second conductor, (ii) the seventh memory cell, and (iii) the first conductor based on a state of the seventh memory cell.

25. The method of claim 24, further comprising:
providing an eighth memory cell having (i) a plurality of states, (ii) a first end, and (iii) a second end;
communicating with the first end of the eighth memory cell and the second end of the third memory cell;
communicating with the second ends of the fourth memory cell and eighth memory cell; and
communicating with the third CLB and the fourth CLB via (i) the first conductor, (ii) the eighth memory cell, and (iii) the second conductor based on a state of the eighth memory cell.

26. The method of claim 25, further comprising providing the single-transistor memory cell in each of the third, fourth, fifth, sixth, seventh, and eighth memory cells.

27. The method of claim 25, further comprising:
generating control signals;
controlling addressing and biasing of the first, second, third, fourth, fifth, sixth, seventh, and eighth memory cells based on the control signals; and
programming a field-programmable gate-array (FPGA) comprising the first, second, third, fourth, fifth, sixth, seventh, and eighth memory cells, the first, second, third, fourth, and fifth CLBs, and the first and second wiring segments.

28. The method of claim 22, further comprising providing N configurable logic elements (CLEs) in the first, second, third, fourth, and fifth CLBs, where N is an integer greater than or equal to 1.

* * * * *